United States Patent
Kim et al.

(10) Patent No.: US 10,431,536 B2
(45) Date of Patent: Oct. 1, 2019

(54) INTERPOSER SUBSTRATE AND SEMICONDUCTOR PACKAGE

(71) Applicant: Samsung Electronics Co., Ltd., Suwon-si (KR)

(72) Inventors: Hyon Chol Kim, Hwaseong-si (KR); Bok Sik Myung, Seongnam-si (KR); Ok Gyeong Park, Yongin-si (KR)

(73) Assignee: SAMSUNG ELECTRONICS CO., LTD., Samsung-ro, Yeongtong-gu, Suwon-si, Gyeonggi-do (KR)

(*) Notice: Subject to any disclaimer, the term of this patent is extended or adjusted under 35 U.S.C. 154(b) by 0 days.

(21) Appl. No.: 16/033,733

(22) Filed: Jul. 12, 2018

(65) Prior Publication Data
US 2019/0198437 A1 Jun. 27, 2019

(30) Foreign Application Priority Data
Dec. 27, 2017 (KR) .......................... 10-2017-0180989

(51) Int. Cl.
*H01L 23/495* (2006.01)
*H01L 23/498* (2006.01)
*H01L 25/10* (2006.01)

(52) U.S. Cl.
CPC .. *H01L 23/49838* (2013.01); *H01L 23/49811* (2013.01); *H01L 23/49822* (2013.01); *H01L 23/49827* (2013.01); *H01L 25/105* (2013.01); *H01L 2225/1041* (2013.01)

(58) Field of Classification Search
CPC ......... H01L 23/49811; H01L 23/49822; H01L 23/49827; H01L 23/49838; H01L 23/5385; H01L 25/18; H01L 25/105
USPC .......................... 257/668, 686, 693, 700, 723
See application file for complete search history.

(56) References Cited

U.S. PATENT DOCUMENTS

| | | |
|---|---|---|
| 5,926,376 A | 7/1999 | Cho |
| 6,084,780 A | 7/2000 | Happoya |
| 6,324,067 B1 | 11/2001 | Nishiyama |
| 7,217,994 B2 * | 5/2007 | Zhu .................... H01L 23/5385 257/686 |
| 8,084,850 B2 | 12/2011 | Shin |
| 9,287,235 B2 | 3/2016 | Sweere |
| 9,305,853 B2 | 4/2016 | Hsu et al. |
| 9,338,900 B2 | 5/2016 | Chou et al. |
| 9,356,006 B2 | 5/2016 | Haba et al. |
| 9,379,090 B1 | 6/2016 | Syed et al. |

(Continued)

FOREIGN PATENT DOCUMENTS

KR    10-1653563 B1    9/2016

*Primary Examiner* — Brook Kebede
(74) *Attorney, Agent, or Firm* — Muir Patent Law, PLLC

(57) ABSTRACT

A semiconductor package includes a first semiconductor package including a first substrate and a lower semiconductor chip mounted on the first substrate, a second semiconductor package stacked on the first semiconductor package and including a second substrate and an upper semiconductor chip mounted on the second substrate, and an interposer substrate interposed between the first semiconductor package and the second semiconductor package and having a recess recessed from a lower surface facing the lower semiconductor chip, wherein the interposer substrate includes a dummy wiring layer disposed to be adjacent to the recess, in a region overlapped with the lower semiconductor chip, and no electrical signal is applied to the dummy wiring layer.

20 Claims, 25 Drawing Sheets

(56) References Cited

U.S. PATENT DOCUMENTS

| | | |
|---|---|---|
| 9,640,513 B2 | 5/2017 | Lee et al. |
| 9,723,729 B2 | 8/2017 | Furusawa et al. |
| 2005/0104196 A1 | 5/2005 | Kashiwazaki |
| 2006/0175696 A1* | 8/2006 | Kim .................. H01L 23/13 |
| | | 257/686 |
| 2006/0255449 A1 | 11/2006 | Lee et al. |
| 2011/0075376 A1 | 3/2011 | Itoh |
| 2016/0247754 A1 | 8/2016 | Fu et al. |

* cited by examiner

INTERPOSER SUBSTRATE AND SEMICONDUCTOR PACKAGE

CROSS-REFERENCE TO RELATED APPLICATION(S)

This application claims the benefit of priority under 35 U.S.C. § 119 to Korean Patent Application No. 10-2017-0180989, filed on Dec. 27, 2017, in the Korean Intellectual Property Office, the disclosure of which is incorporated herein by reference in its entirety.

BACKGROUND

1. Field

The disclosure relates to an interposer substrate and a semiconductor package including the same.

2. Description of Related Art

With the development of the electronics industry, demand for multifunctional, high-speed, and compact electronic components is on the increase. According to this tendency, a method of mounting a plurality of semiconductor chips on a single package substrate in a stacking manner or stacking a package on a package has been developed. In particular, various attempts have been made to improve reliability of package-on-package (PoP) devices in which a package is stacked on a package.

SUMMARY

An aspect of the present disclosure is to provide an interposer substrate having enhanced reliability and a semiconductor package including the same.

According to some embodiments, the disclosure is directed to a semiconductor package comprising: a first semiconductor package including a first substrate and a lower semiconductor chip mounted on the first substrate; a second semiconductor package stacked on the first semiconductor package and including a second substrate and an upper semiconductor chip mounted on the second substrate; and an interposer substrate interposed between the first semiconductor package and the second semiconductor package and having a recess recessed from a lower surface facing the lower semiconductor chip, wherein the interposer substrate includes a dummy wiring layer disposed to be adjacent to the recess in a region overlapped with the lower semiconductor chip, and wherein the dummy wiring layer is electrically floating.

According to some embodiments, the disclosure is directed to a semiconductor package comprising: a substrate; a semiconductor chip mounted on the substrate; an interposer substrate disposed on the semiconductor chip and electrically connected to the substrate; and connecting terminals connecting the substrate and the interposer substrate, wherein the interposer substrate includes: a core insulating layer having an embedded wiring layer; a lower insulating layer disposed below the core insulating layer and having a recess recessed from a lower surface facing the semiconductor chip; a dummy wiring layer disposed between the embedded wiring layer and the semiconductor chip above the recess, the dummy wiring layer being electrically floating; and an interconnecting wiring layer disposed on a lower surface of the lower insulating layer and connected to the connecting terminals, on a periphery of the recess.

According to some embodiments, the disclosure is directed to an interposer substrate comprising: a core insulating layer having an embedded wiring layer; a lower insulating layer disposed below the core insulating layer and having a recess recessed from a lower surface at the center of the lower surface; and a dummy wiring layer disposed on a lower surface of the core insulating layer above the recess, wherein the dummy wiring layer is electrically floating.

BRIEF DESCRIPTION OF DRAWINGS

The above and other aspects, features, and advantages will be more clearly understood from the following detailed description, taken in conjunction with the accompanying drawings, in which.

DETAILED DESCRIPTION

Hereinafter, example embodiments will be described with reference to the accompanying drawings.

Figure 1:
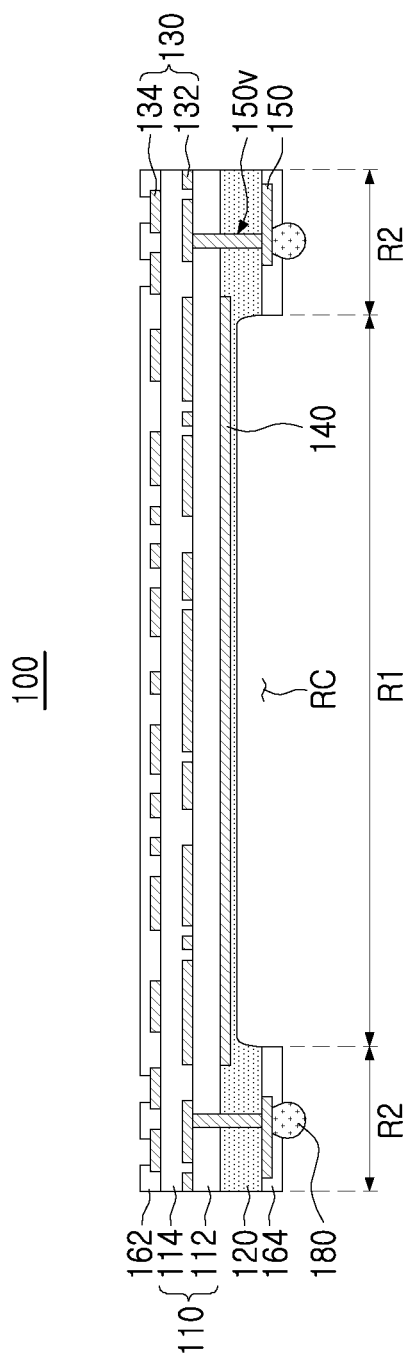
FIG. 1 is a schematic cross-sectional view of an interposer substrate according to an example embodiment.

FIG. 1 is a schematic cross-sectional view of an interposer substrate according to example embodiments.

Referring to FIG. 1, an interposer substrate 100 may have a first region R1 located in the center and formed with a recess region RC, and a second region R2 surrounding the first region R1. The first region R1 may be a region in which the recess region RC, a depression, corresponding to at least one semiconductor chip of a lower package, is formed in a lower portion thereof, and the second region R2, which protrudes downwardly relative to the first region R1, may be a region directly connected to the lower package (not shown).

The interposer substrate 100 may include a core insulating layer 110, wiring layers 130, a lower insulating layer 120 disposed on a lower surface of the core insulating layer 110, and a dummy wiring layer 140 disposed on the lower surface of the core insulating layer 110. The interposer substrate 100 may further include interconnecting wiring layers 150 disposed around the recess region RC (e.g., in the second region R2), connecting terminals 180 disposed on a lower surface of the interconnecting wiring layers 150, and first and second passivation layers 162 and 164 disposed in outermost positions. For example, the interconnecting wiring layers 150 may be disposed on a periphery of the recess region RC, extending around all sides of the perimeter of the recess region RC, The second passivation layer 164 may cover the interconnecting wiring layer 150 and lower regions of the connecting terminals 180 that are nearer to the interconnecting wiring layer 150.

The core insulating layer 110 may include first and second core insulating layers 112 and 114 stacked vertically. The wiring layers 130 may be disposed on upper and/or lower surfaces of the first and second core insulating layers 112 and 114, respectively. In the example embodiments, the number of insulating layers constituting the core insulating layer 110 and the number of conductive layers constituting the wiring layers 130 may be varied.

The core insulating layer 110 may include a thermosetting resin such as an epoxy resin or a thermoplastic resin such as polyimide. The core insulating layer 110 may be, but is not limited to, a photosensitive insulating layer. The core insulating layer 110 may further include an inorganic filler. For example, the core insulating layer 110 may be formed of a resin impregnated with a core material such as glass fiber (glass cloth or glass fabric) together with an inorganic filler, e.g., prepreg, Ajinomoto build-up film (ABF), FR-4, or bismaleimide triazine (BT).

The wiring layers 130 may be disposed on one surface of each of the first and second core insulating layers 112 and 114, and may include first and second wiring layers 132 and 134. The wiring layers 130 may serve to redistribute pads of a semiconductor chip mounted on the interposer substrate 100. The wiring layers 130 may be formed of a conductive material and may include copper (Cu), aluminum (Al), silver (Ag), tin (Sn), gold (Au), nickel (Ni) lead (Pb), titanium (Ti), or alloys thereof.

In FIG. 1, the first and second wiring layers 132 and 134 are illustrated schematically but may include vias penetrating through the first and second core insulating layers 112 and 114. The first wiring layer 132 may be disposed as an embedded wiring layer embedded in the core insulating layer 110 and the second wiring layer 134 may be disposed on the upper surface of the core insulating layer 110. For example, the first wiring layer 132 may be formed on an upper surface of the first core insulating layer 112, and the second wiring layer 134 may be formed on an upper surface of the second core insulating layer 114. However, the design of the wiring layers 130 may be varied in example embodiments.

The lower insulating layer 120 may be disposed below the core insulating layer 110 and may have the recess region RC recessed from a lower surface thereof. For example, the recess region RC may be formed in, and may be surrounded by, the lower insulating layer 120. Accordingly, the lower insulating layer 120 may have different thicknesses in the vertical direction in the first region R1 and the second region R2. An inner side surface of the lower insulating layer 120 defining the recess region RC may be curved as illustrated in FIG. 1, but embodiments are not limited thereto. For example, the inner side surface of the lower insulating layer 120 that defines the recess region RC may be linear and extending entirely in the vertical direction (e.g., having no horizontal components) or extending in the diagonal direction (e.g., having both vertical and horizontal components). When the inner side surface of the lower insulating layer 120 is curved, the recess region RC may have a shape increased in width downwardly. For example, the width of the recess region RC may be smaller toward the bottom surface of the recess region RC nearer to the core insulating layer 110. The depth and width of the recess region RC may be varied in example embodiments according to forms in which the interposer substrate 100 is mounted.

The lower insulating layer 120 may include a thermosetting resin such as an epoxy resin or a thermoplastic resin such as polyimide. The lower insulating layer 120 may be formed of the same material as that of at least one of the core insulating layers 110 or may be formed of a different material. For example, the core insulating layer 110 may include a prepreg and the lower insulating layer 120 may be formed of a resin and an inorganic filler without glass fibers. In this case, a process of forming the recess region RC in the lower insulating layer 120 may be performed more easily.

The dummy wiring layer 140 may be disposed on the lower surface of the core insulating layer 110 and may be disposed within the lower insulating layer 120. For example, an upper surface of the dummy wiring layer 140 may be disposed on the lower surface of the core insulating layer 110, and the lower insulating layer 120 may cover a lower and side surfaces of the dummy wiring layer 140. As used herein, the term "dummy" is used to refer to a component that has the same or similar structure and shape as other components but does not have a substantial function and exists only as a pattern in the device. Therefore, the dummy wiring layer 140 may be a layer which is not electrically connected to wiring structures including the wiring layers 130 and exists only as a pattern without receiving an electrical signal in the interposer substrate 100. The dummy wiring layer 140 may serve to protect the wiring layers 130 thereabove in the process of forming the recess region RC during a manufacturing process and may also serve to prevent warpage of the interposer substrate 100. A lower surface of the dummy wiring layer 140 may be covered with the lower insulating layer 120. The dummy wiring layer 140 may include a metal and may be formed of the same material as that of the wiring layers 130 but is not limited thereto. The dummy wiring layer 140 may comprise one or more dummy wires being formed as patterned elements of the dummy wiring layer 140 and that are each electrically floating (i.e., not connected to a voltage source or logic circuitry to provide an electrical signal thereto). The dummy wiring layer 140 may be patterned from the same conductive layer(s) forming such normal wiring layers (e.g., interconnecting wiring layers 150). For example, the dummy wiring layer 140 may be simultaneously formed with normal wiring layers with the same processes that deposit and pattern the conductive layer(s) forming normal wiring layers.

The interconnecting wiring layers 150 may be disposed on the lower surface of the lower insulating layer 120 around the recess region RC. The interconnecting wiring layers 150 may be disposed only on the protruding lower surface of the lower insulating layer 120 in the second region R2. The interconnecting wiring layers 150 may be pads on which the lower connecting terminals 180 are disposed or may be a redistribution layer of a plurality of patterns.

The interconnecting wiring layers 150 may include vias 150v connected to the first wiring layers 132 through the lower insulating layer 120 and the first core insulating layer 112. The vias 150v may have a tapered shape, a cylindrical shape, or the like. The interconnecting wiring layers 150 may include a metal and may be formed of the same material as that of the wiring layers 130 but is not limited thereto.

The connecting terminals 180 may be disposed on lower surfaces of the interconnecting wiring layers 150 exposed to a lower side. The connecting terminals 180 may include a copper pillar and/or a solder.

The first and second passivation layers 162 and 164 may be disposed on an upper surface of the core insulating layer 110 and a lower surface of the lower insulating layer 120, respectively. The first and second passivation layers 162 and 164 may be disposed to expose portions of the second wiring layers 134 and the connecting terminals 18 disposed on the interconnecting wiring layers 150. The first and second passivation layers 162 and 164 may be formed of an oxide or a nitride or may be formed of a resin. For example, the first and second passivation layers 162 and 164 may be formed of a photoresist material or a resin coated copper (RCC).

Figure 2:
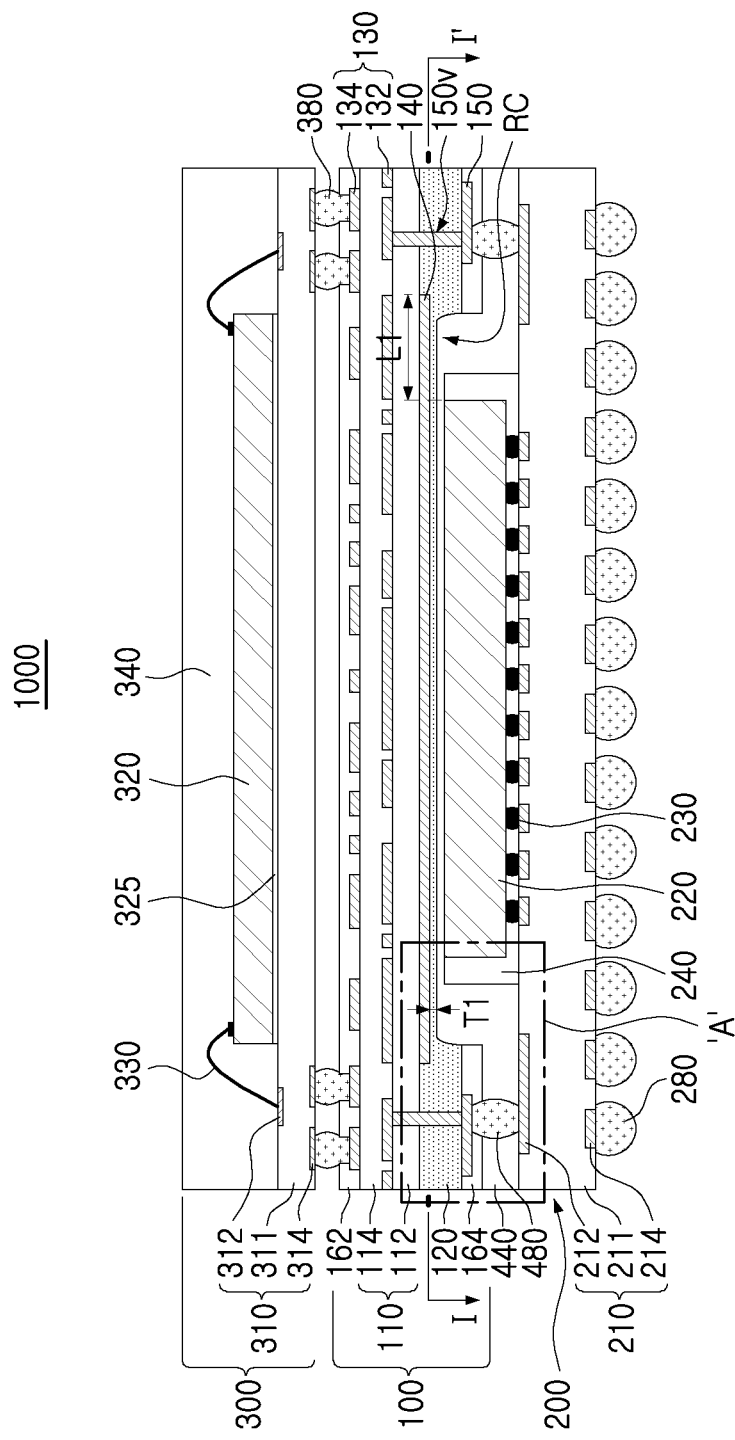
FIG. 2 is a schematic cross-sectional view of a semiconductor package according to example embodiments.

FIG. 2 is a schematic cross-sectional view of a semiconductor package according to example embodiments.

Figure 3:
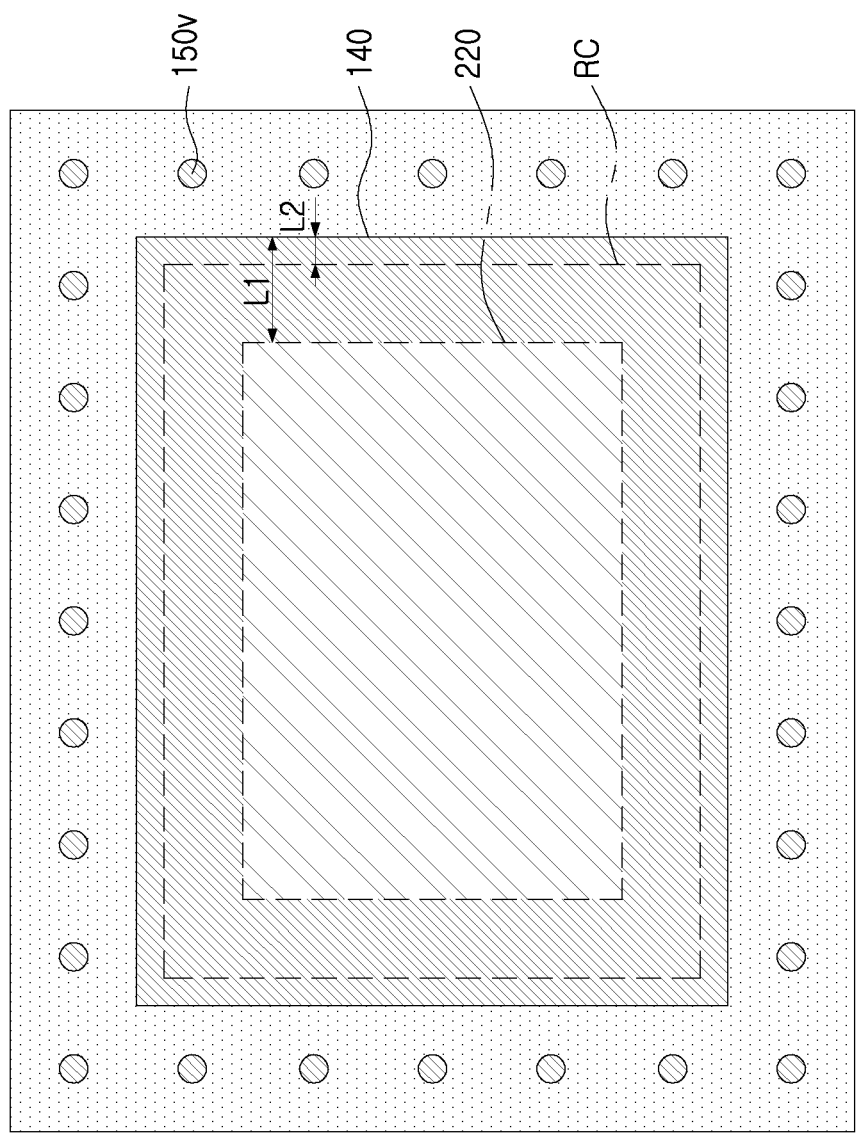
FIG. 3 is a schematic plan view along line I-I' of the semiconductor package of FIG. 2.

FIG. 3 is a schematic plan view of the semiconductor package of FIG. 2, taken along line I-I'.

Referring to FIG. 2, a semiconductor package 1000 includes a first semiconductor package 200, a second semiconductor package 300, and an interposer substrate 100. The semiconductor package 1000 may be a package-on-package (POP) type package in which the second semiconductor package 300 is stacked on the first semiconductor package 200.

The first semiconductor package 200 may include a first substrate 210, a lower semiconductor chip 220, a first connection portion 230, a first encapsulant 240, and a first terminal portion 280. The second semiconductor package 300 may include a second substrate 310, an upper semiconductor chip 320, a second connection portion 330, a second encapsulant 340, and a second terminal portion 380.

The first and second substrates 210 and 310 may include, respectively, body portions 211 and 311, upper pads 212 and 312 exposed at upper surfaces of the body portions 211 and 311, and lower pads 214 and 314 exposed at lower surfaces of the body portions 211 and 311. The first and second substrates 210 and 310 may include, for example, silicon (Si), glass, ceramic, or plastic. The first and second substrates 210 and 310 may be a single layer or may have a multilayer structure including wiring patterns therein.

The lower semiconductor chip 220 and the upper semiconductor chip 320 may include a logic semiconductor chip and/or a memory semiconductor chip. The logic semiconductor chip may be a microprocessor, for example, a central processing unit (CPU), a controller, or an application specific integrated circuit (ASIC). The memory semiconductor chip may be a volatile memory such as a dynamic random access memory (DRAM) or a static random access memory (SRAM) or may be a non-volatile memory such as a flash memory. For example, the lower semiconductor chip 220 may be an application processor (AP) chip, and the upper semiconductor chip 320 may be a memory chip. The lower semiconductor chip 220 and the upper semiconductor chip 320 may include a plurality of semiconductor chips.

In the present example embodiment, a lower surface of the lower semiconductor chip 220 may be an active surface and an upper surface of the upper semiconductor chip 320 may be an active surface, but the arrangement positions of the active surfaces may be varied in example embodiments. Therefore, the upper semiconductor chip 320 may also be mounted as a flip-chip type.

The first and second connection portions 230 and 330 may electrically connect the lower semiconductor chip 220 and the upper semiconductor chip 320 to the upper pads 212 and 312 of the first and second substrates 210 and 310, respectively. The first connection portion 230 may be in the form of a solder ball, and the second connection portion 330 may include a wire. However, specific types of the first and second connection portions 230 and 330 are not limited thereto and may include various types of signal transmission mediums. An adhesive layer 325 may serve to adhere the upper semiconductor chip 320 to the second substrate 310.

The first and second encapsulants 240 and 340 may be disposed to cover the lower semiconductor chip 220 and the upper semiconductor chip 320 to serve to protect the lower semiconductor chip 220 and the upper semiconductor chip 320, respectively. The first and second encapsulants 240 and 340 may be formed of, for example, a silicone-based material, a thermosetting material, a thermoplastic material, an ultraviolet (UV) treatment material, or the like. The first and second encapsulants 240 and 340 may be formed of a polymer such as a resin, for example, an epoxy molding compound (EMC). The first encapsulant 240 may be disposed such that an upper surface of the lower semiconductor chip 220 is exposed, thus lowering an overall height of the first semiconductor package 200. For example, the first encapsulant 240 may not cover the upper surface of the lower semiconductor chip 220.

The first and second terminal portions 280 and 380 may be disposed on the lower surfaces of the first and second substrates 210 and 310, respectively. The first terminal portion 280 may connect the semiconductor package 1000 to a main board, or the like, of an electronic device on which the semiconductor package 1000 is mounted. The second terminal portion 380 may connect the second semiconductor package 300 to the interposer substrate 100 so that the first and second semiconductor packages 200 and 300 are electrically connected to each other. For example, the first and second semiconductor packages 200 and 300 may be electrically connected to each other through the interposer substrate 100. The first and second terminal portions 280 and 380 may include at least one of a conductive material such as solder, tin (Sn), silver (Ag), copper (Cu), and aluminum (Al). The first and second terminal portions 280 and 380 may have different sizes and may be varied in shape, such as a land, a ball, and a pin.

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two device, an electrically insulative underfill or mold layer, etc.) is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes.

The details described above with reference to FIG. 1 may be applied to the interposer substrate 100. The interposer substrate 100 may be disposed on the first semiconductor package 200, and the second semiconductor package 300 may be mounted on the interposer substrate 100. The first semiconductor package 200 and the interposer substrate 100 may be connected by a vertical connecting portion 480 and a space therebetween may be filled with a vertical encapsulant 440. The interposer substrate 100 and the second semiconductor package 300 may be electrically connected to each other as the second terminal portion 380 and the second wiring layer 134 are connected.

The vertical connecting portion 480 may electrically connect the interconnecting wiring layers 150 of the interposer substrate 100 and the upper pad 212 of the first substrate 210. The vertical connecting portion 480 may be formed as the connecting terminals 180 of the interposer substrate 100 of FIG. 1 are connected to connecting terminals of the first semiconductor package 200. The number and arrangement of the vertical connecting portions 480 disposed on one side of the lower semiconductor chip 220 may be varied in the example embodiments. The vertical connecting portion 480 may include a conductive material, e.g., at least one of solder, tin (Sn), silver (Ag), copper (Cu), and aluminum (Al), similarly to the first and second terminal portions 280 and 380.

The vertical encapsulant 440 may encapsulate a space between the first semiconductor package 200 and the interposer substrate 100. Similar to the first and second encapsulants 240 and 340, the vertical encapsulant 440 may be formed of a silicone-based material, a thermosetting material, a thermoplastic material, a UV treatment material, or the like. However, according to example embodiments, the vertical encapsulant 440 may be omitted and, in this case, the space between the first semiconductor package 200 and the interposer substrate 100 may be filled with air.

At least a portion of the lower semiconductor chip 220 of the first semiconductor package 200 may be inserted into the recess region RC of the interposer substrate 100. Accordingly, the lower insulating layer 120 of the interposer substrate 100 may be disposed to cover at least portions of an upper surface and the side surfaces of the lower semiconductor chip 220. In this manner, since the interposer substrate 100 has the recess region RC, although the relatively thick semiconductor chip is disposed therebelow, an overall thickness of the semiconductor package 1000 may not be increased and the vertical connection portion 480 may be arranged by a fine pitch. When the semiconductor chip is relatively thick, thermal resistance of the semiconductor package 1000 may be reduced. According to results of experiment, thermal resistance of the semiconductor package 1000 according to the example embodiment was reduced by about 11%, as compared with a comparative example in which an overall thickness was the same and a thickness of the lower semiconductor chip 220 was thinner as it did not include the recess region RC.

In an upper portion of the recess region RC, a thickness T1 of the lower insulating layer 120 on the lower surface of the dummy wiring layer 140 may be varied according to the example embodiments. When the dummy wiring layer 140 is covered with the lower insulating layer 120, the dummy wiring layer 140 may be protected from an external impact and adhesion between the vertical encapsulant 440 and the interposer substrate 100 may be improved.

The dummy wiring layer 140 of the interposer substrate 100 may be disposed between the wiring layers 130 and the lower semiconductor chip 220. As illustrated in FIG. 3, when viewed in a top-down view, the dummy wiring layer 140 may overlap a region in which the lower semiconductor chip 220 is disposed and may be arranged as a single pattern larger than the lower semiconductor chip 220. The dummy wiring layer 140 may be disposed to be larger than the recess region RC, while including an upper region of the recess region RC. For example, when viewed in the top-down view, the area of the dummy wiring layer 140 may be larger than the area of the recess region RC. The dummy wiring layer 140 may extend from the first semiconductor chip 220 by a first length L1 and may extend on one side from the recess region RC by a second length L2 smaller than the first length L1. Accordingly, the dummy wiring layer 140 may protect the upper wiring layers 130 when the recess region RC is formed. The dummy wiring layer 140 may also serve to dissipate heat generated by the lower semiconductor chip 220.

Figure 4A:
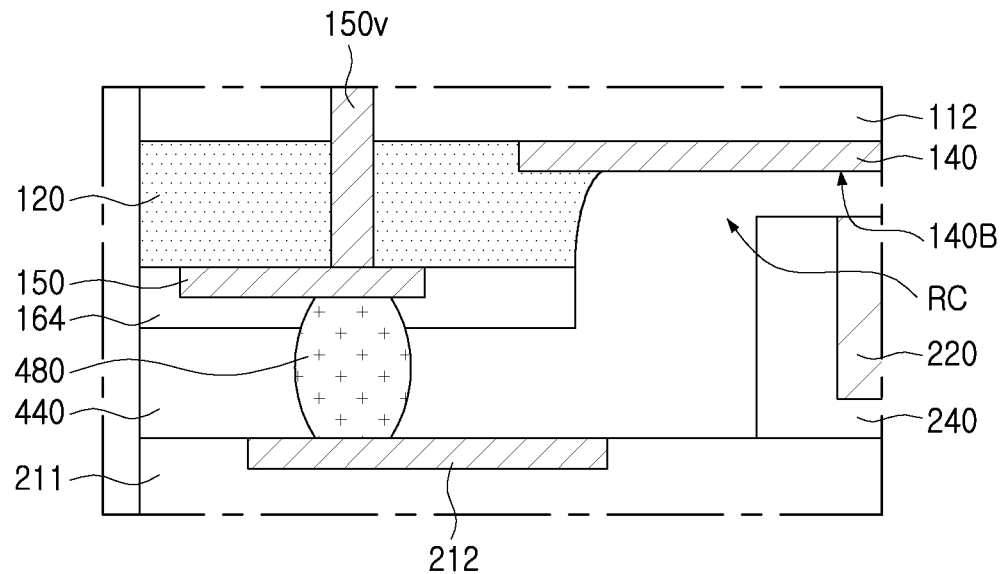
FIGS. 4A and 4B are schematic partial cross-sectional views of semiconductor packages according to example embodiments.
Figure 4B:
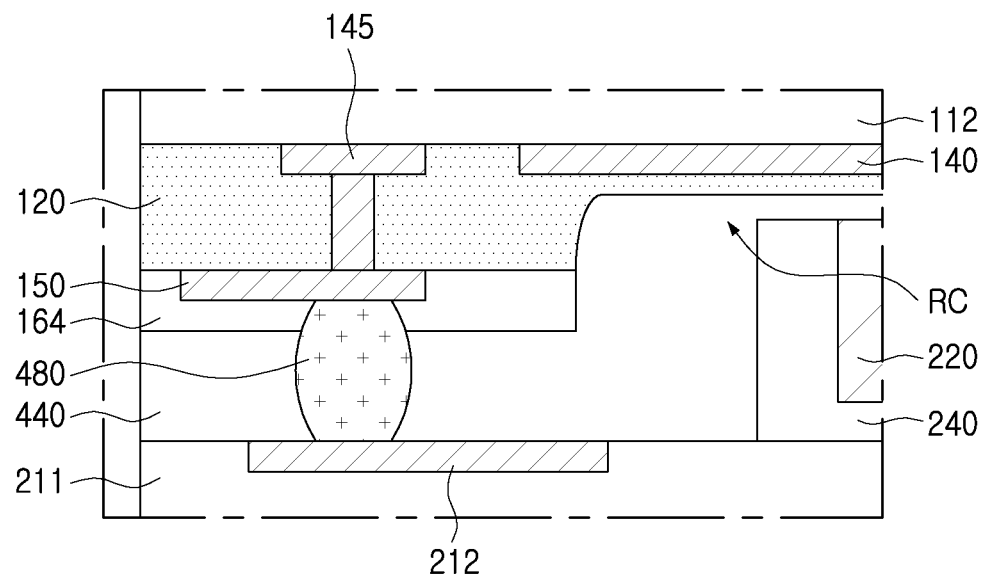

FIGS. 4A and 4B are schematic partial cross-sectional views of semiconductor packages according to example embodiments. Specifically, FIGS. 4A and 4B are enlarged views of a region corresponding to a region 'A' of FIG. 2.

Referring to FIG. 4A, a semiconductor package of this example embodiment may have a structure in which a portion of the dummy wiring layer 140 is exposed from the lower insulating layer 120, unlike the example embodiment of FIG. 2. A lower surface 140B of the dummy wiring layer 140 may be exposed to the recess region RC so as to be in contact the vertical encapsulant 440. Such a structure may be formed according to process conditions of a manufacturing process to form the recess region RC. In this case, since the lower surface 140B of the dummy wiring layer 140 disposed adjacent to the lower semiconductor chip 220 is exposed to the upper surface of the lower semiconductor chip 220, a heat dissipation function of the semiconductor package may further be improved. As used herein, the term "contact" refers to a connection contact (i.e., touching) unless the context indicates otherwise.

Referring to FIG. 4B, a semiconductor package of this example embodiment may further include a peripheral wiring layer 145 disposed on the same vertical level as the dummy wiring layer 140 on a lower surface of the first core insulating layer 112, unlike the example embodiment of FIG. 2. The peripheral wiring layer 145 may be patterned in the vicinity of the recess region RC to perform a redistribution function. The peripheral wiring layer 145 may have a same thickness in the vertical direction as that of the dummy wiring layer 140. The peripheral wiring layer 145 may be connected to the interconnecting wiring layer 150 by the vias 150v and may be electrically connected to the wiring layers 130 on the first core insulating layer 112. Since the peripheral wiring layer 145 is further arranged in the vicinity of the recess region RC, the redistribution function of the interposer substrate 100 may further be improved.

Figure 5A:
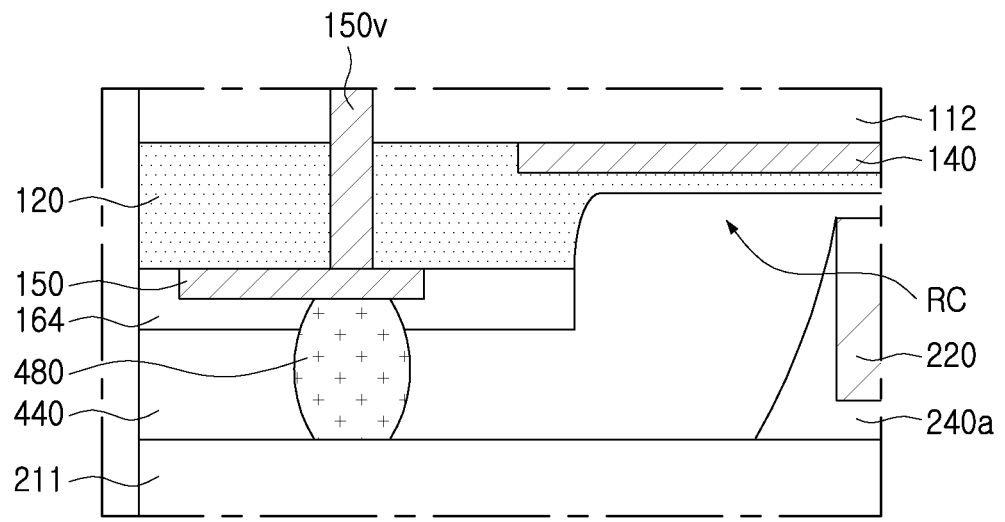
FIGS. 5A and 5B are schematic partial cross-sectional views of semiconductor packages according to example embodiments.
Figure 5B:
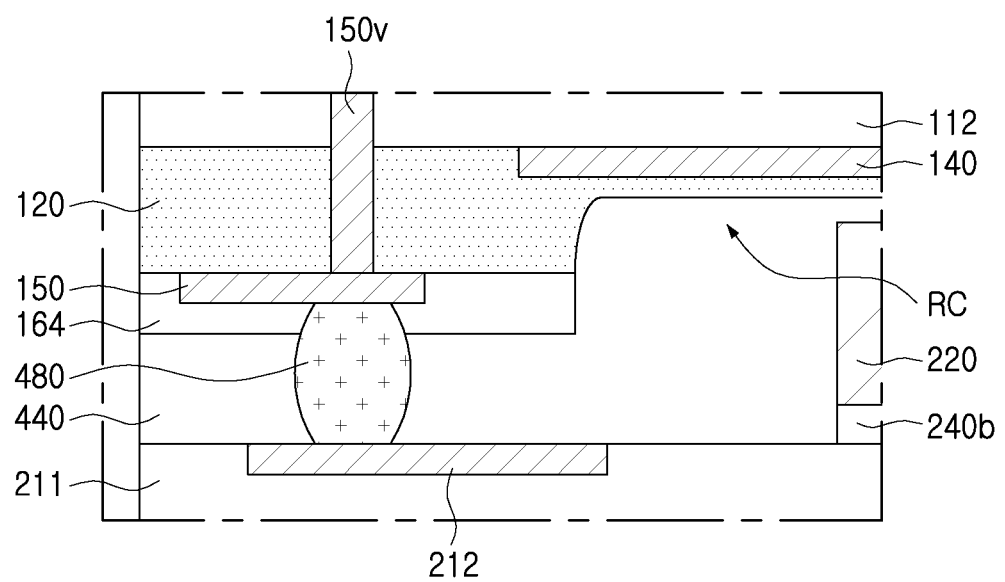

FIGS. 5A and 5B are schematic partial cross-sectional views of semiconductor packages according to example embodiments. Specifically, FIGS. 5A and 5B are enlarged views of a region corresponding to the region 'A' of FIG. 2.

Referring to FIG. 5A, in a semiconductor package, a first encapsulant 240a may have a sloped side surface on the side of the lower semiconductor chip 220, unlike the example embodiment of FIG. 2. This structure may be derived from a material and a process to form the first encapsulant 240a. The first encapsulant 240a may be formed of, for example, an underfill resin such as an epoxy resin. A position and a degree of tilt (e.g., an angle of a side surface of the first encapsulant 240a relative to side surfaces of the lower semiconductor chip 220) of an upper end of the first encapsulant 240a may be varied in example embodiments. For example, in example embodiments, the upper end of the first encapsulant 240a may be located at a middle portion of the side surface of the lower semiconductor chip 220.

Referring to FIG. 5B, in a semiconductor package, a first encapsulant 240b may be limitedly disposed on a lower surface of the lower semiconductor chip 220, unlike the example embodiment of FIG. 2. This structure may be derived from a material and a process to form the first encapsulant 240b. The first encapsulant 240b may be formed of, for example, an adhesive film. A position and a shape of a side surface of the first encapsulant 240b may be varied in example embodiments. For example, in example embodiments, the side surface of the first encapsulant 240b may have a shape protruding from the side surface of the lower semiconductor chip 220. As another example, the side surface of the first encapsulant 240b may be aligned with the side surface of the lower semiconductor chip 220.

Figure 6:
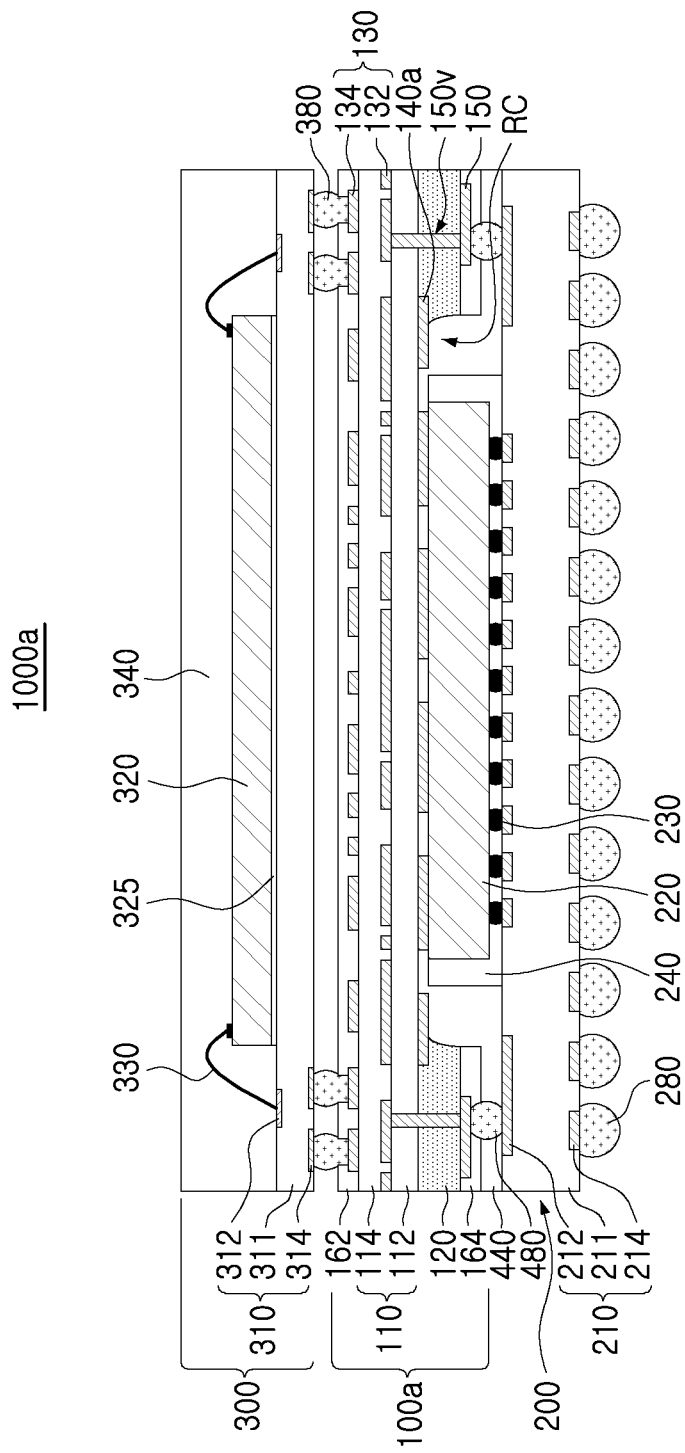
FIGS. 6 and 7 are schematic cross-sectional views of semiconductor packages according to example embodiments.
Figure 7:
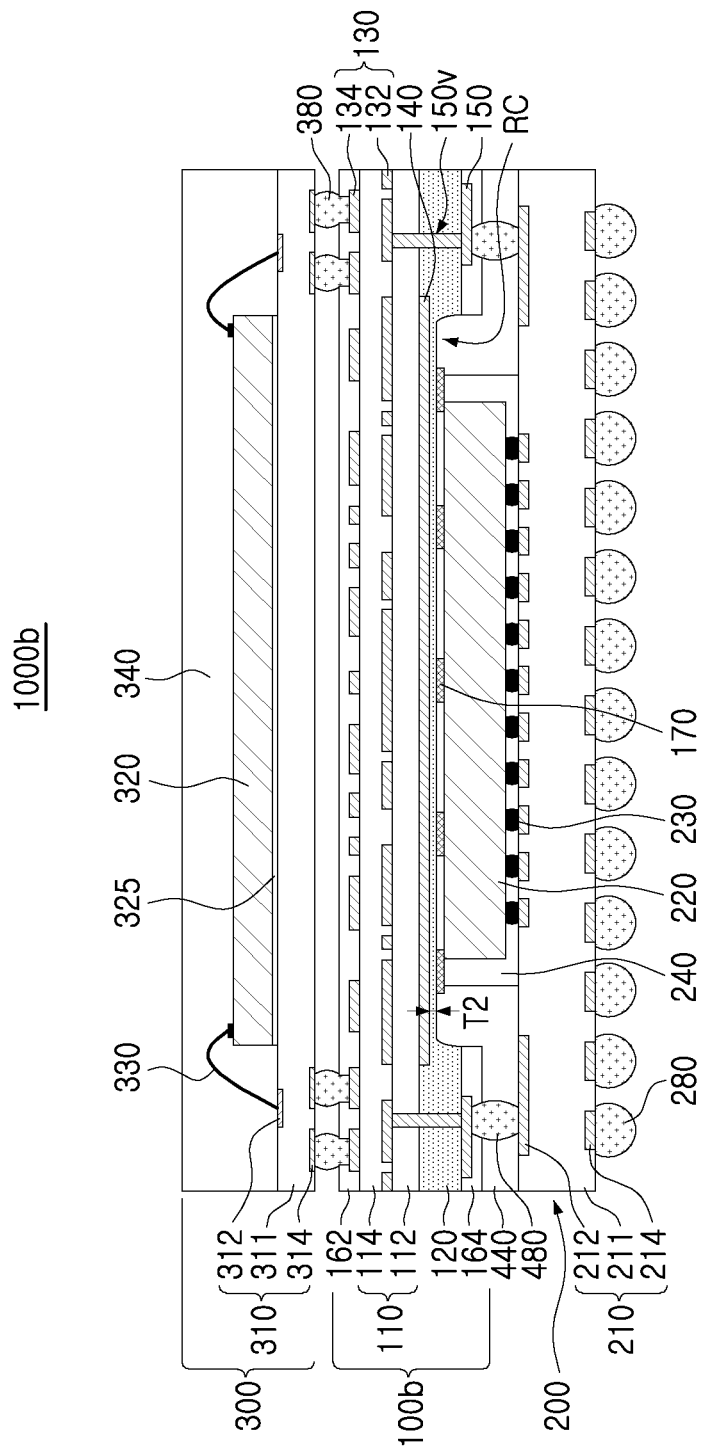

FIGS. 6 and 7 are schematic cross-sectional views of semiconductor packages according to example embodiments.

Referring to FIG. 6, in a semiconductor package 1000a, a dummy wiring layer 140a of an interposer substrate 100a may be patterned and disposed to be in contact with the lower semiconductor chip 220, unlike the example embodiment of FIG. 2.

The dummy wiring layer 140a may be formed of a plurality of patterns spaced apart from each other on a lower surface of the core insulating layer 110. The patterned form of the dummy wiring layer 140a will be described in more detail with reference to FIGS. 8A through 8C hereinafter.

The dummy wiring layer 140a may have a structure in which at least a portion thereof is exposed from the lower insulating layer 120. For example, at least a portion of the dummy wiring layer 140a is not covered by the lower insulating layer 120. In addition, unlike in the example embodiment of FIG. 4A, the dummy wiring layer 140a may be in contact with the upper surface of the lower semiconductor chip 220 but is not limited thereto. When the dummy wiring layer 140a is in direct contact with the lower semiconductor chip 220, a gap between the interposer substrate 100a and the first semiconductor package 200 may be maintained by the dummy wiring layer 140a, and accordingly, flow of a material forming the vertical encapsulant 440 may become smooth to facilitate formation of the vertical encapsulant 440. Further, heat dissipation of heat generated by the lower semiconductor chip 220 may further be facilitated.

Referring to FIG. 7, a semiconductor package 1000b may include an interposer substrate 100b further including protrusions 170, unlike the example embodiment of FIG. 2. The protrusions 170 may be disposed on the lower surface of the lower insulating layer 120 and may have a patterned form. The patterned form of the protrusions 170 will be described in more detail with reference to FIGS. 8A through 8C hereinafter.

The protrusions 170 may be arranged to be in contact with the lower semiconductor chip 220, similar to that of the dummy wiring layer 140a of FIG. 6. Accordingly, a gap between the interposer substrate 100b and the first semiconductor package 200 may be maintained and formation of the vertical encapsulant 440 may be facilitated. Further, in a case in which the protrusions 170 are formed of a metal, heat dissipation of the semiconductor package 1000b may further be ensured. The protrusions 170 may be formed of a metal or an insulating material, for example, copper (Cu) or an epoxy resin.

The protrusions 170 may be spaced apart from the dummy wiring layer 140, and the lower insulating layer 120 may be interposed therebetween. However, a thickness T2 of the lower insulating layer 120 in an area where the lower insulating layer 120 is interposed between the protrusions 170 and the dummy wiring layer 140 may be varied in example embodiments. For example, in some embodiments, the thickness T2 may be zero, and, in such a case, the protrusions 170 may be disposed on the lower surface of the dummy wiring layer 140.

Figure 8A:
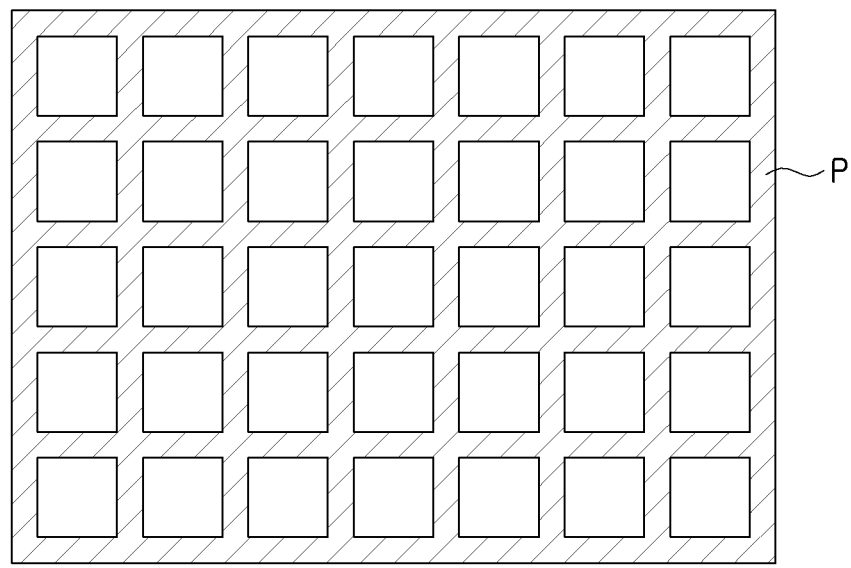
FIGS. 8A through 8C are schematic plan views illustrating a configuration of a semiconductor package according to example embodiments.
Figure 8B:
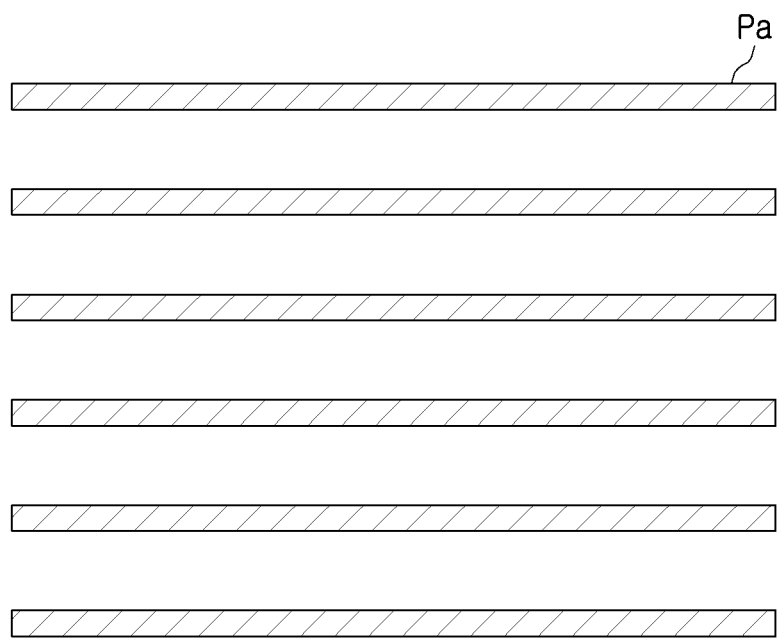
Figure 8C:
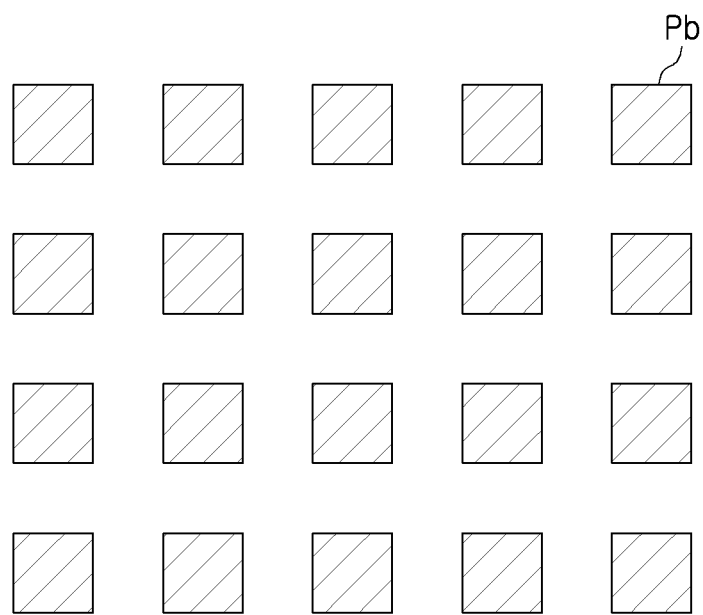

FIG. 8A through FIG. 8C are schematic plan views illustrating a configuration of a semiconductor package according to example embodiments. Specifically, FIGS. 8A through 8C illustrate patterned form of the dummy wiring layer 140a of FIG. 6 and the protrusion 170 of FIG. 7 by way of example.

Referring to FIGS. 8A to 8C, the dummy wiring layer 140a of FIG. 6 and the protrusions 170 of FIG. 7 may be arranged in various patterns P, Pa and Pb at an upper portion of the recess region RC. As illustrated in FIG. 8A, the dummy wiring layer 140a and the protrusions 170 may have a pattern P in a mesh form. Alternatively, as illustrated in FIG. 8B, the dummy wiring layer 140a and the protrusions 170 may have a repeating line pattern Pa extending in one direction. Alternatively, as illustrated in FIG. 8C, the dummy wiring layer 140a and the protrusions 170 may have repeating quadrangular or circular patterns Pb spaced apart from each other. In this manner, the dummy wiring layers 140a and the protrusions 170 may be patterned and arranged in various forms. Forms or shapes of patterns P, Pa and Pb may be determined in consideration of materials of the dummy wiring layer 140a and the protrusions 170, a space between the interposer substrates 100a and 100b and the first semiconductor package 200, material properties of the vertical encapsulant 440, heat dissipation characteristics of the semiconductor packages 1000a and 1000b, and the like.

Figure 9:
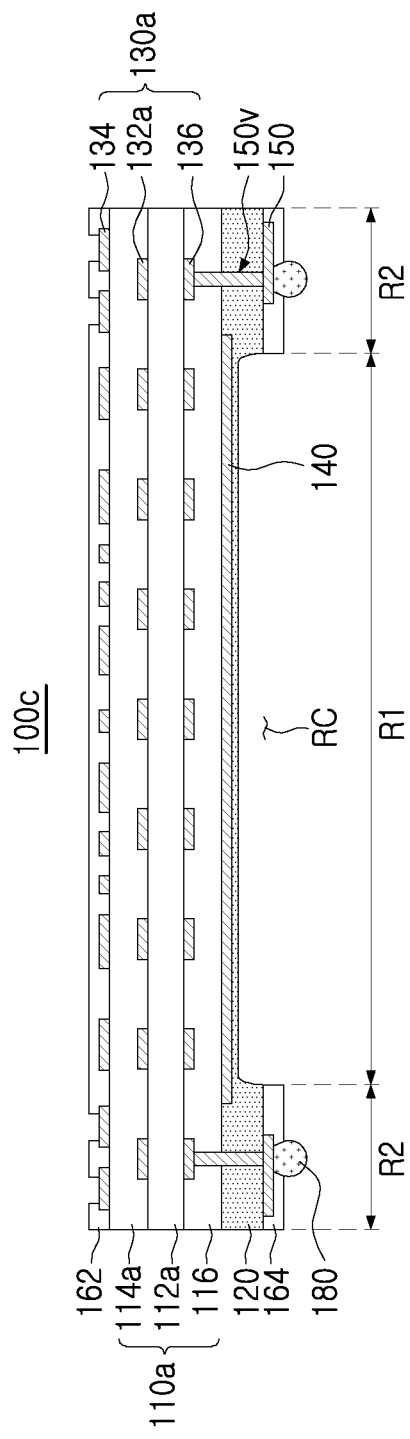
FIGS. 9 and 10 are schematic cross-sectional views of interposer substrates according to example embodiments.
Figure 10:
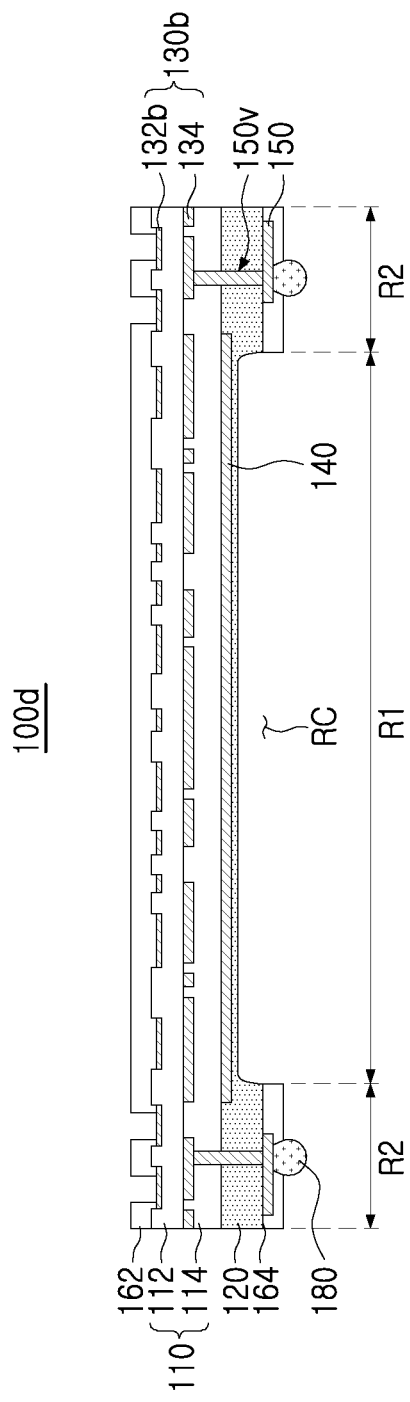

FIGS. 9 and 10 are schematic cross-sectional views of interposer substrates according to example embodiments.

Referring to FIG. 9, in an interposer substrate 100c, the number of first to third core insulating layers 112a, 114a, and 116 constituting the core insulating layer 110a is different and the number of first to third wiring layers 132a, 134, and 136 constituting the wiring layers 130a and an arrangement thereof may be different, compared with the example embodiment of FIG. 1.

The interposer substrate 100c may be manufactured by forming the first and third wiring layers 132a and 136 on upper and lower surfaces of the first core insulating layer 112a and subsequently forming the second and third core insulating layers 114a and 116 on the first core insulating layer 112a to cover the first and third wiring layers 132a and 136, respectively. Thereafter, the second wiring layer 134 and the dummy wiring layer 140 may be formed on an upper surface of the second core insulating layer 114a and on a lower surface of the third core insulating layer 116, respectively. That is, the interposer substrate 100c may have a structure manufactured in a core form.

Accordingly, the first core insulating layer 112a may have a structure in which the first and third wiring layers 132a and 136 are disposed on the upper and lower surfaces of the first core insulating layer 112a, without the wiring layer 130 embedded therein. In example embodiments, the number of the core insulating layers 110a and the wiring layers 130a stacked vertically based on the first core insulating layer 112a may be varied.

Referring to FIG. 10, as compared with the example embodiment of FIG. 1, an interposer substrate 100d may have a different arrangement of the first wiring layers 132b constituting the wiring layers 130b.

The interposer substrate 100d may be manufactured by sequentially stacking first wiring layers 132b, a first core insulating layer 112, second wiring layers 134, and a second core insulating layer 114, in this order, on a separate core member and subsequently removing the core member. For example, the interposer substrate 100d may have a structure of an embedded trace substrate (ETS). Accordingly, the first wiring layers 132b may be disposed to be recessed from an upper surface of the first core insulating layer 112. For example, at least a portion of the first wiring layers 132b may be exposed in an upper surface of the core insulating layer 112, and an upper surface the first wiring layers 132b may be positioned on a lower vertical level than the upper surface of the core insulating layer 112.

FIGS. 11A through 11E are views schematically illustrating a major process of a method of manufacturing an interposer substrate according to example embodiments. In FIGS. 11A through 11E, a method of manufacturing the interposer substrate 100 of FIG. 1 is illustrated.

Figure 11A:
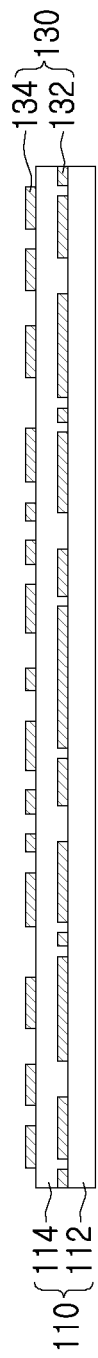
FIGS. 11A through 11E are views schematically illustrating a major process of a method of manufacturing an interposer substrate according to example embodiments.

Referring to FIG. 11A, the core insulating layer 110 and the wiring layers 130 may be stacked.

The first core insulating layer 112, the first wiring layer 132, the second core insulating layer 114, and the second wiring layer 134 may be sequentially stacked on a separate core member (not shown). Although not illustrated, the wiring layers 130 may include vias penetrating through the core insulating layer 110. The core member may be removed after the core insulating layer 110 and the wiring layers 130 are formed in this stage.

The core insulating layer 110 may be formed, for example, by compressing an insulating resin to the form of an uncured film using a laminator and curing the insulating resin. Or, the core insulating layer 110 may be formed through a method of applying an insulating material for forming a buildup layer and subsequently curing the insulating material. The wiring layers 130 may be formed using a dry film pattern or a method such as chemical vapor deposition (CVD), physical vapor deposition (PVD), a subtractive method, an additive method using electroless copper plating or electrolytic copper plating, a semi-additive process (SAP), a modified semi-additive process (MSAP), or the like. The vias may be formed by forming a via hole using mechanical drilling and/or laser drilling and filling the via hole with a conductive material.

Figure 11B:
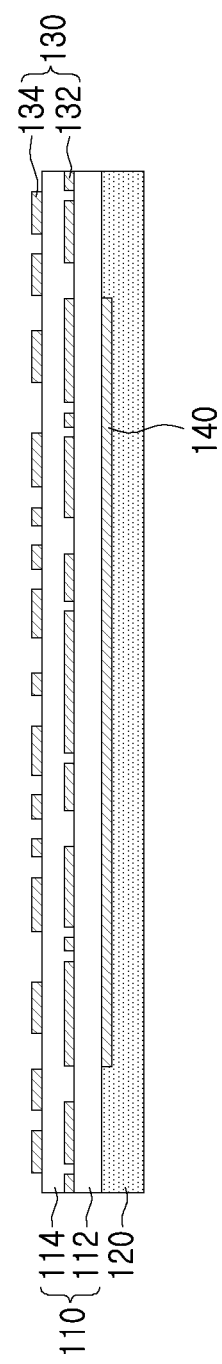

Referring to FIG. 11B, a dummy wiring layer 140 and a lower insulating layer 120 may be formed on a lower surface of the core insulating layer 110.

The dummy wiring layer 140 and the lower insulating layer 120 may be formed by a method similar to that of the wiring layers 130 and the core insulating layer described above. In this stage, a separate support member (not illustrated) may be adhered to an upper surface of the second wiring layer 134, and the dummy wiring layer 140 and the lower insulating layer 120 may be formed. The dummy wiring layer 140 may be conformally formed on a bottom surface of the first core insulating layer 112, and may have a uniform thickness in a vertical direction. In an example embodiment, the lower insulating layer 120 may be formed of the same material as that of the first core insulating layer 112 and may be formed of a different material than the second core insulating layer 114, but the embodiments are not limited thereto. For example, the lower insulating layer 120 may be formed of only resin and an inorganic filler without glass fibers.

Figure 11C:
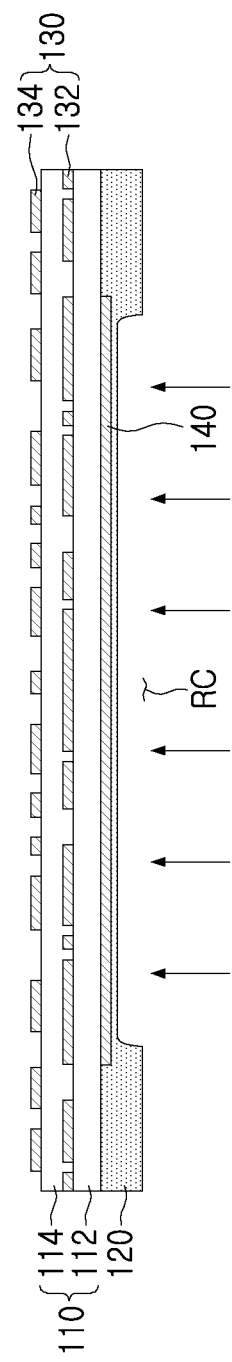

Referring to FIG. 11C, a portion of the lower insulating layer 120 may be removed from the lower surface of the lower insulating layer 120 to form the recess region RC.

The recess region RC may be formed by an etching process such that only a region in which the recess region RC is to be formed is exposed, for example, with a mask layer. The etching process may be, for example, a chemical etching process. During the etching, the dummy wiring layer 140 may protect the upper wiring layers 130 from an etching agent. Also, even in a case in which the lower insulating layer 120 is completely removed from the lower portion of the dummy wiring layer 140 (see, e.g., FIG. 4A), the upper core insulating layer 110 may not be damaged by virtue of the dummy wiring layer 140.

Figure 11D:
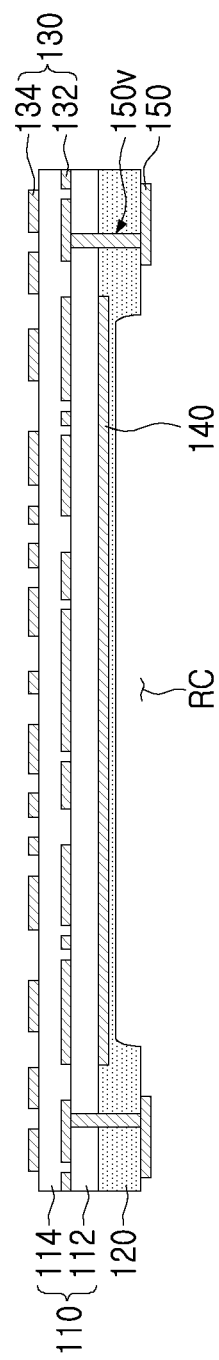

Referring to FIG. 11D, an interconnecting wiring layer 150 may be formed on a lower surface of the lower insulating layer 120.

The interconnecting wiring layer 150 may be formed by forming a plating layer on the entire lower surface of the lower insulating layer 120 and subsequently patterning the plating layer. The interconnecting wiring layer 150 may include a via 150v, and here, the via 150v may be formed by forming a via hole extending to the first wiring layer 132 and subsequently filling the via hole with a conductive material.

The interposer substrate 100a of the semiconductor package 1000a of FIG. 6 may be manufactured by exposing the dummy wiring layer 140a in the stage described above with reference to FIG. 11C and covering the region in which the interconnecting wiring layer 150 is formed with the mask layer with only the recess region RC left open, and subsequently patterning the dummy wiring layer 140a in this stage.

The interposer substrate 100b of the semiconductor package 1000b of FIG. 7 may be manufactured by covering the region in which the interconnecting wiring layer 150 is formed with the mask layer with only the recess region RC left open, and subsequently forming the protrusions 170 on the lower insulating layer 120 in this stage.

Figure 11E:
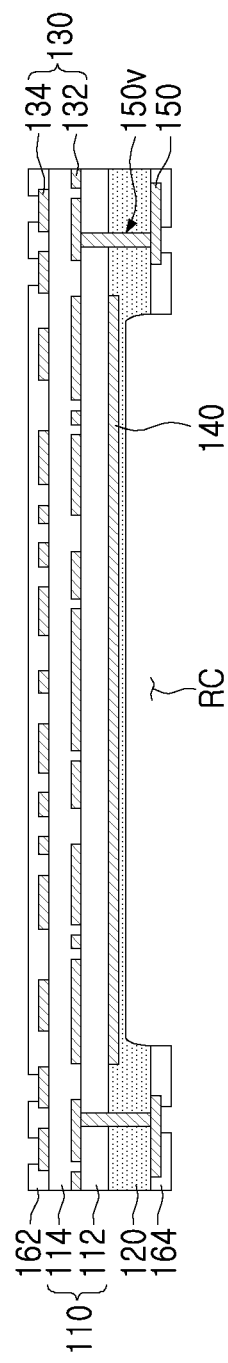

Referring to FIG. 11E, the first and second passivation layers 162 and 164 may be formed on the upper surface of the core insulating layer 110 and the lower surface of the lower insulating layer 120, respectively.

If a separate support member has been adhered to the upper surface of the second wiring layer 134, the first and second passivation layers 162 and 164 may be formed after removing the support member. The first and second passivation layers 162 and 164 may be formed such that portions of the second wiring layer 134 and the interconnecting wiring layer 150 are exposed.

Thereafter, the connecting terminals 180 may be formed on the exposed lower surface of the interconnecting wiring layers 150 as illustrated in FIG. 1, thus manufacturing the interposer substrate 100.

Figure 12A:
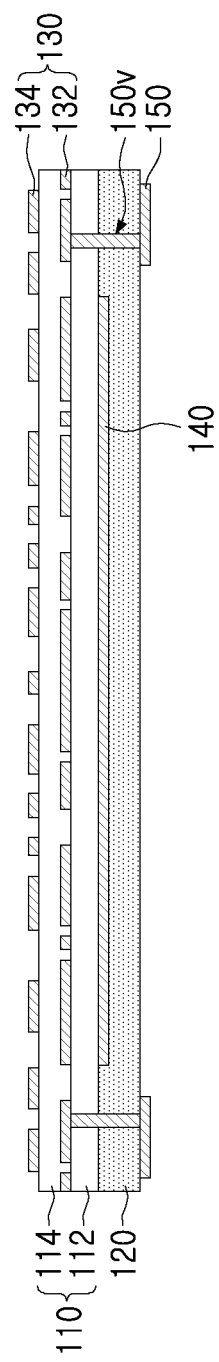
FIGS. 12A through 12C are views schematically illustrating a major process of a method of manufacturing an interposer substrate according to example embodiments.
Figure 12B:
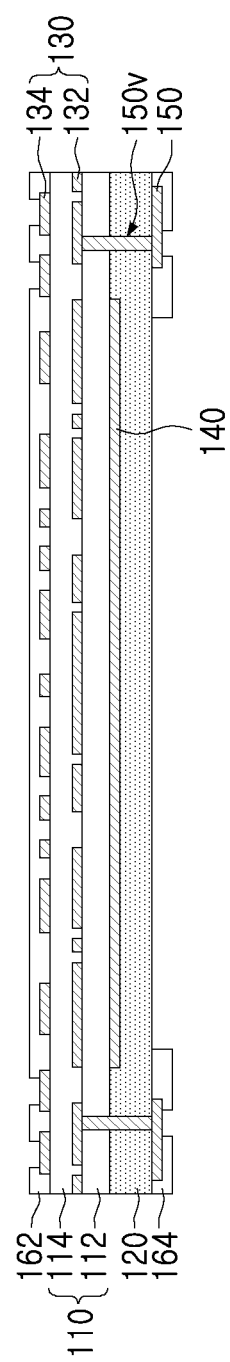
Figure 12C:
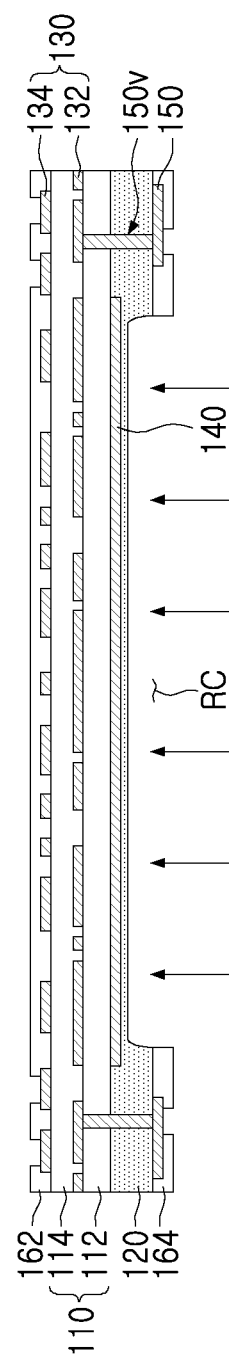

FIGS. 12A through 12C are views schematically illustrating a major process of a method of manufacturing an interposer substrate according to example embodiments. In FIGS. 12A through 12C, another method of manufacturing the interposer substrate 100 of FIG. 1 is illustrated.

Referring to FIG. 12A, first, the process described above with reference to FIGS. 11A and 11B may be performed in the same manner to form a multilayer structure including the core insulating layer 110, the lower insulating layer 120, and the wiring layers 130.

Next, the dummy wiring layer 140 and the lower insulating layer 120 may sequentially be formed on the lower surface of the core insulating layer 110, and the interconnecting wiring layer 150 may be formed on the lower surface of the lower insulating layer 120. The interconnecting wiring layer 150 may include a via 150v, and the via 150v may be formed by forming a via hole extending to the first wiring layer 132 and subsequently filling the via hole with a conductive material.

Referring to FIG. 12B, the first and second passivation layers 162 and 164 may be formed on the upper surface of the core insulating layer 110 and the lower surface of the lower insulating layer 120, respectively.

In a case in which a separate support member has been adhered to the upper surface of the second wiring layer 134, the first and second passivation layers 162 and 164 may be formed after removing the support member. According to example embodiments, the first and second passivation layers 162 and 164 may be formed without being patterned in this stage or may be formed after the process described hereinafter with reference to FIG. 12C.

Referring to FIG. 12C, portions of the lower insulating layer 120 and the second passivation layer 164 may be removed from the lower surface to form the recess region RC.

The recess region RC may be formed through a sandblast process in a state in which only the region in which the recess region RC is to be formed is exposed with the mask layer. In this case, the side surface of the recess region RC may be formed to be more sloped than the case of forming through the aforementioned etching, but the embodiments are not limited thereto. During the sandblasting, the dummy wiring layer 140 may protect the upper wiring layers 130. Also, even when the lower insulating layer 120 is fully removed from the lower portion of the dummy wiring layer 140, the upper core insulating layer 110 may not be damaged by virtue of the dummy wiring layer 140.

Thereafter, the connecting terminals 180 may be formed on the exposed lower surface of the interconnecting wiring layers 150 as illustrated in FIG. 1, thus manufacturing the interposer substrate 100.

Figure 13A:
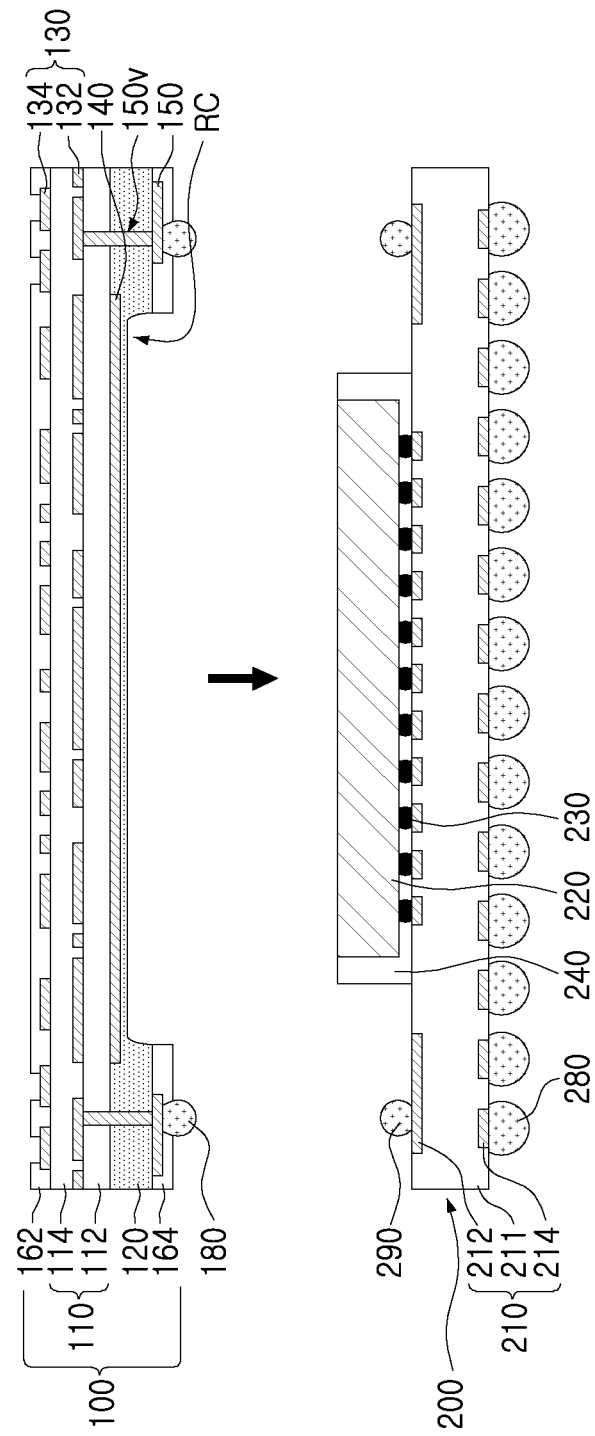
FIGS. 13A and 13B are views schematically illustrating a major process of a method of manufacturing a semiconductor package according to example embodiments.
Figure 13B:
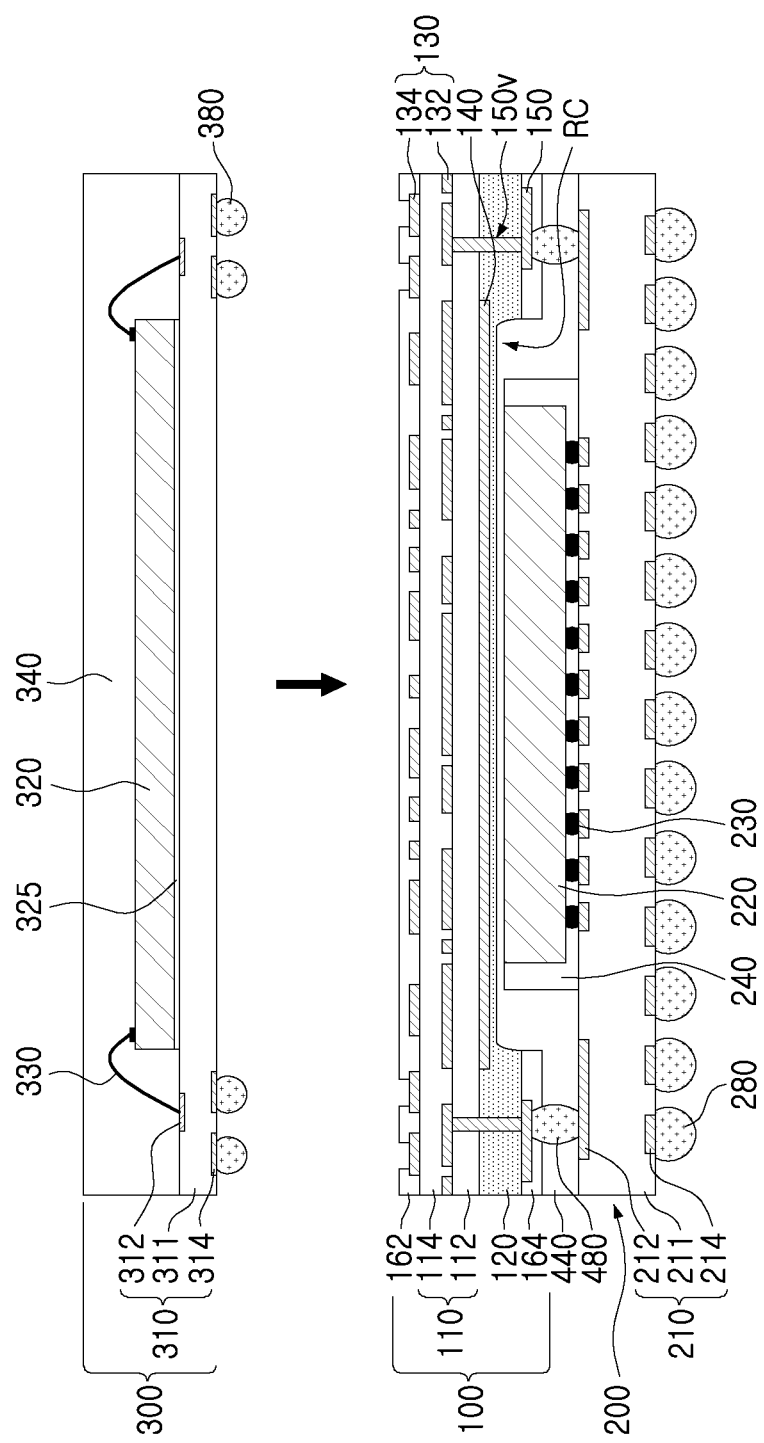

FIGS. 13A and 13B are views schematically illustrating a major process in a method of manufacturing a semiconductor package according to example embodiments.

Referring to FIG. 13A, the interposer substrate 100 may be stacked on the first semiconductor package 200.

The first semiconductor package 200 may be prepared by mounting the lower semiconductor chip 220 on the first substrate 210. The interposer substrate 100 may be prepared by the methods described above with reference to FIGS. 11A through 12C.

The first semiconductor package 200 and the interposer substrate 100 may be bonded to each other by connecting the connecting terminals 290 of the first semiconductor package 200 and the connecting terminals 180 of the interposer substrate 100. The connecting terminals 290 of the first semiconductor package 200 and the connecting terminals 180 of the interposer substrate 100 may be bonded to form the vertical connecting portion 480 of FIG. 2. At least a portion of the lower semiconductor chip 220 may be inserted into the recess region RC of the interposer substrate 100 and may be coupled thereto by, for example, a bonding process. After the bonding, the vertical encapsulant 440 of FIG. 2 may be formed, thereby filling a gap between the first semiconductor package 200 and the interposer substrate 100.

Referring to FIG. 13B, the second semiconductor package 300 may be stacked on the multilayer structure including the first semiconductor package 200 and the interposer substrate 100.

The second semiconductor package 300 may be mounted on the interposer substrate 100 and connected through the second terminal portion 380. The second terminal portion 380 may be bonded to the second wiring layer 134 of the interposer substrate 100.

Figure 14:
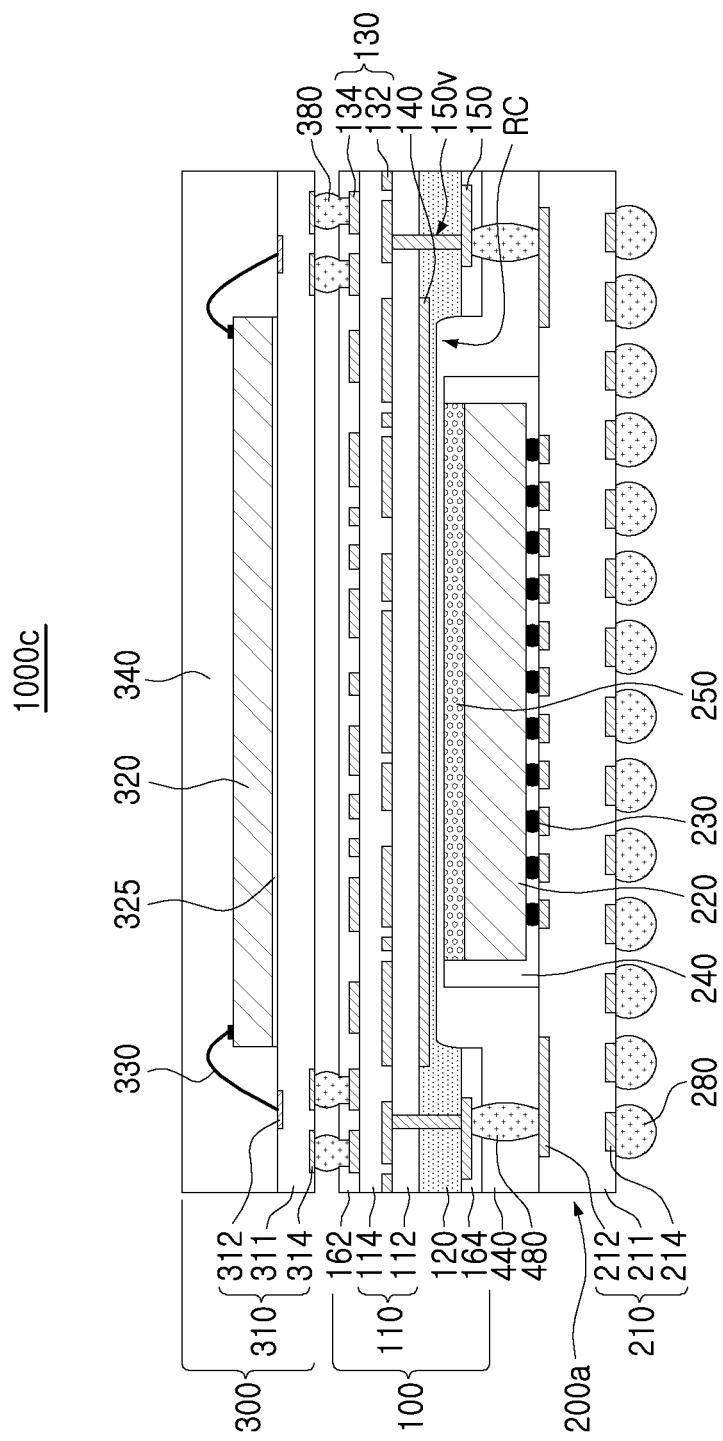
FIGS. 14 through 16 are schematic cross-sectional views of semiconductor packages according to example embodiments.
Figure 15:
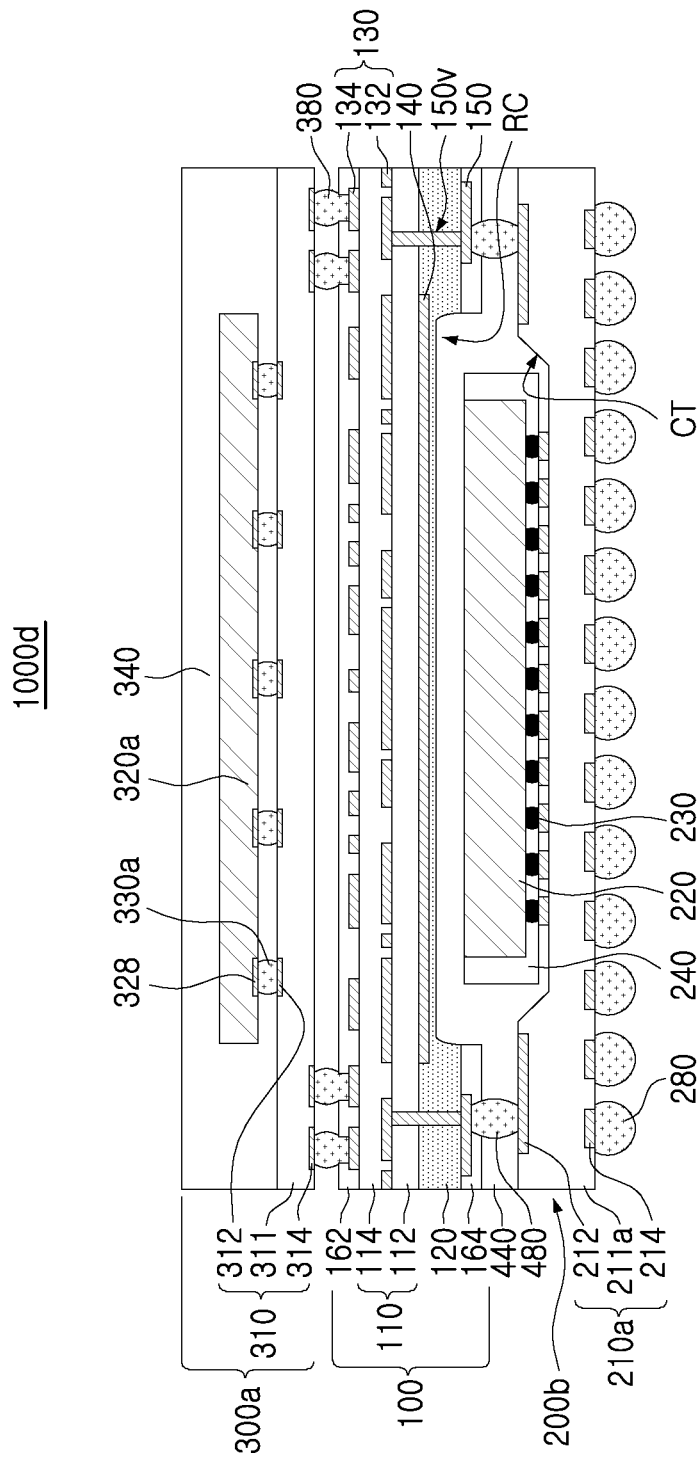
Figure 16:
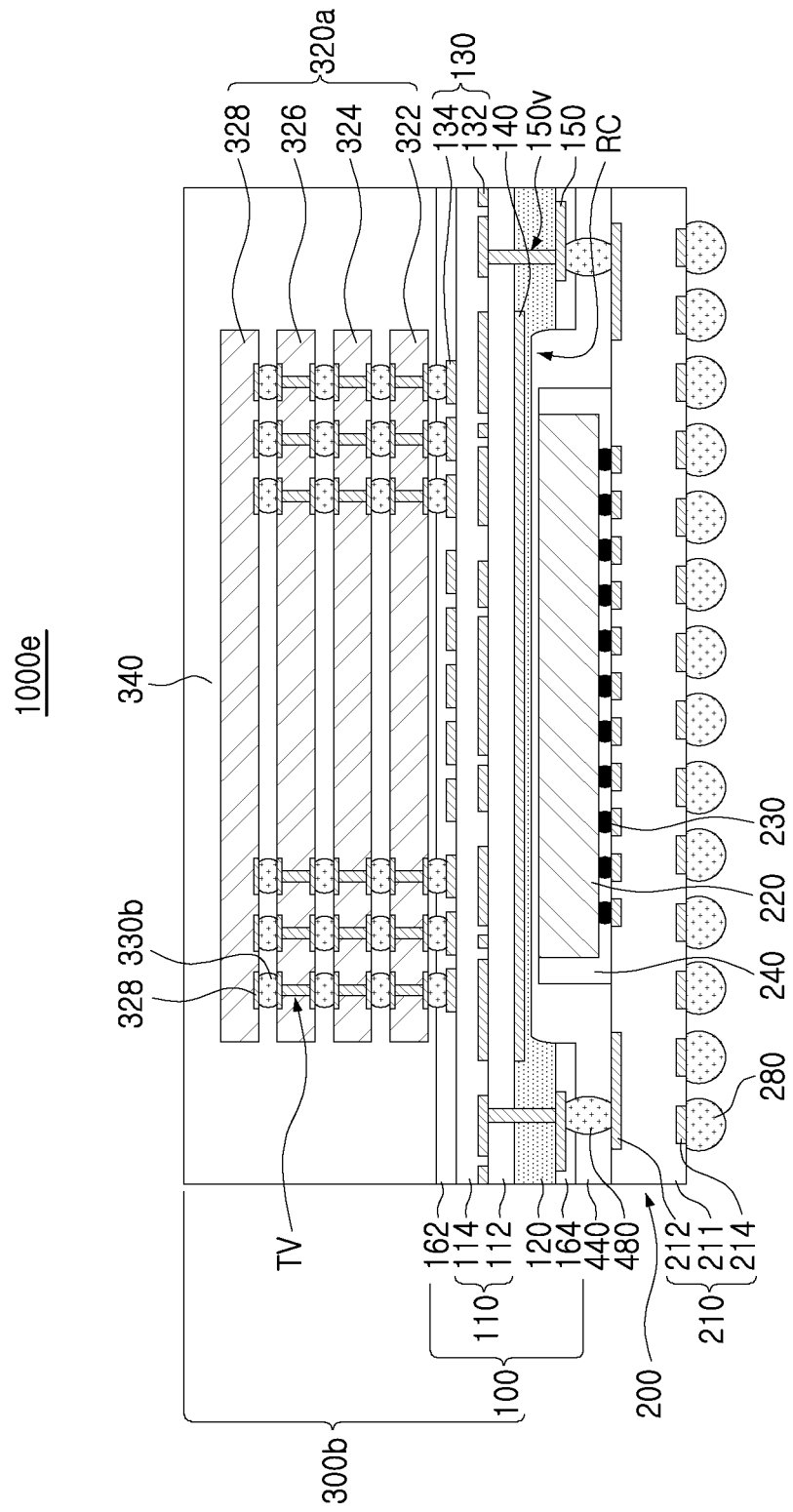

FIGS. 14 through 16 are schematic cross-sectional views of semiconductor packages according to example embodiments.

Referring to FIG. 14, a semiconductor package 1000c may further include the heat dissipating layer 250 disposed on an upper surface of the lower semiconductor chip 220 in the first semiconductor package 200a, unlike the semiconductor package 1000 of FIG. 2.

The heat dissipating layer 250 may be formed of a material having high thermal conductivity. The heat dissipating layer 250 may be at least one of a metal and graphite. In a case in which the heat dissipating layer 250 is formed of graphite, since graphite has high thermal conductivity in a horizontal direction, heat generated by a specific region in the lower semiconductor chip 220 may be rapidly spread and dissipated horizontally, reducing heat. The shape and arrangement position of the heat dissipating layer 250 may be varied in example embodiments. In the example of FIG. 14, the heat dissipating layer 250 has a same shape as the lower semiconductor chip 220, when viewed in a plan view, completely covering a top surface of the lower semiconductor chip 220. Although the heat dissipating layer 250 is disposed on the lower semiconductor chip 220, since the interposer substrate 100 includes the recess region RC, an increase in the overall thickness of the semiconductor package 1000c may be prevented.

Referring to FIG. 15, a semiconductor package 1000d is different from the example embodiment of FIG. 2, in that the first substrate 210a has a cavity region CT and the upper semiconductor chip 320a of the second semiconductor package 300a may be mounted in the form of a flip-chip on the second substrate 310.

The first substrate 210a may have the cavity region CT formed as a region in which the lower semiconductor chip 220 is to be mounted is recessed from an upper surface thereof. Accordingly, side surfaces of the lower semiconductor chip 220 may be surrounded vertically by portions of the cavity region CT of the lower first substrate 210a and the recess region RC of the upper interposer substrate 100. Accordingly, the overall thickness of the semiconductor package 1000d may be further reduced.

In the second semiconductor package 300a, the upper semiconductor chip 320a may be connected to the upper pad 312 of the second substrate 310 by a second connection portion 330a. The second connection portion 330a may be a solder ball or a bump and may connect the substrate pad 328 of the upper semiconductor chip 320a and the upper pad 312 of the second substrate 310.

The structure of the first substrate 210a and/or the second semiconductor package 300a may also be applied to the semiconductor packages 1000a, 1000b, 1000c, and 1000e of the other example embodiments.

Referring to FIG. 16, the semiconductor package 1000e may have a structure in which the second semiconductor package 300b uses the interposer substrate 100 as a substrate, unlike the example embodiment of FIG. 2. That is, the upper semiconductor chips 320a, instead of a package, may be directly mounted on the interposer substrate 100.

The upper semiconductor chip 320a may include first to fourth upper semiconductor chips 322, 324, 326, 328 and may be vertically stacked and connected by second connection portions 330b. The second connection portions 330b may be solder balls or bumps, and may connect the substrate pads 328 of the upper semiconductor chips 320a to each other, and in a lowermost portion, the second connection portions 330b may be connected to the second wiring layer 134 of the interposer substrate 100. The upper semiconductor chips 320a may include through electrodes TV disposed therein and penetrating therethrough. The second encapsulant 340 may be arranged to fill spaces between the upper semiconductor chips 320a. In this manner, according to example embodiments, the upper semiconductor chips 320a may be directly mounted on the interposer substrate 100, and a mounting type and the number of the mounted upper semiconductor chips 320a may be varied in example embodiments.

Figure 17:
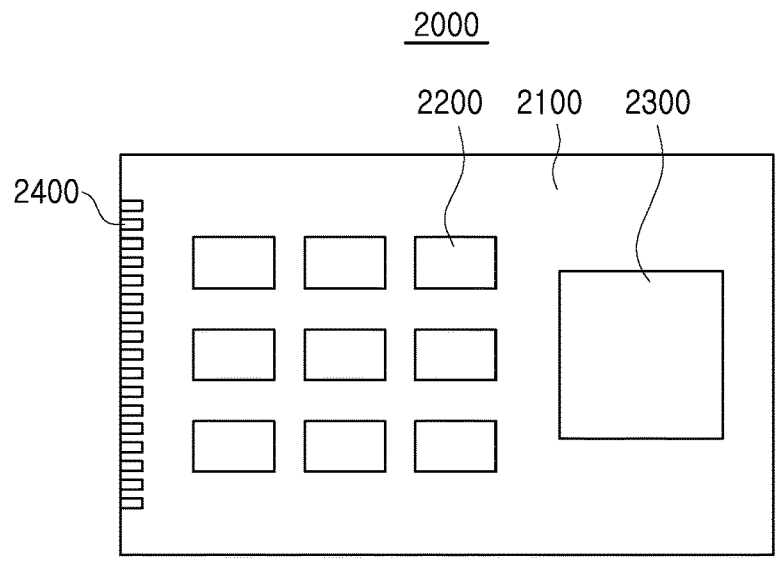
FIG. 17 is a schematic view of a package module including a semiconductor package according to example embodiments.

FIG. 17 is a schematic view of a package module including a semiconductor package according to example embodiments.

Referring to FIG. 17, a package module 2000 may be provided in a form including one or more semiconductor integrated circuit (IC) chips 2200 and a quad-flat package (QFP)-packaged semiconductor IC chip 2300. The package module 2000 may be formed by installing the semiconductor IC chips 2200 and 2300 to which the semiconductor packages according to example embodiments are applied on a substrate 2100. The package module 2000 may be connected to an external electronic device through an external connecting terminal 2400 provided on one side of the substrate 2100.

Figure 18:
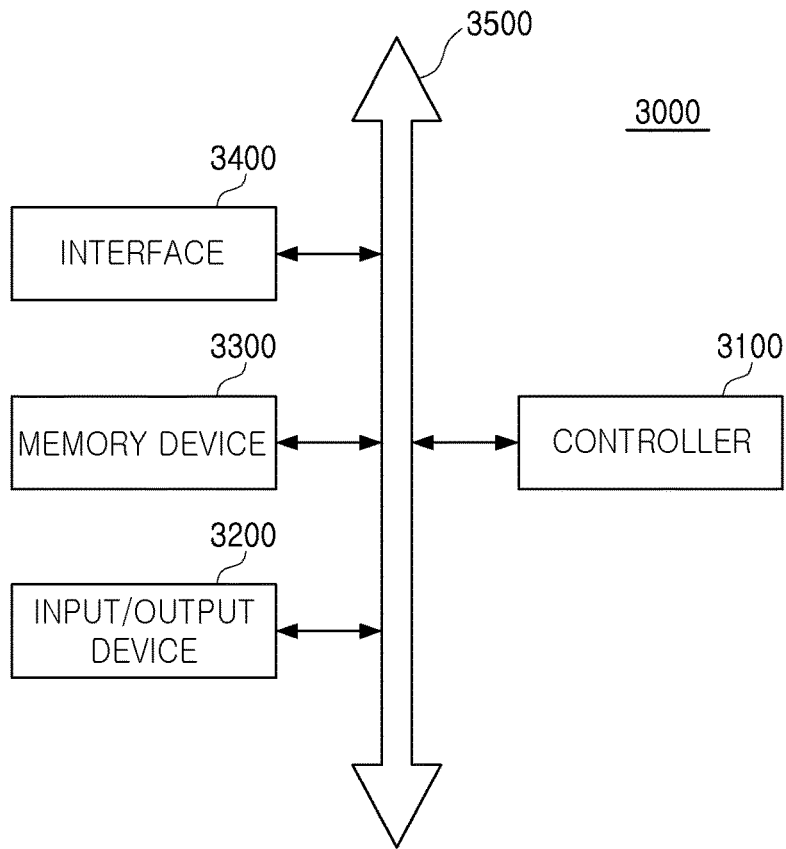
FIG. 18 is a schematic block diagram of an electronic device including a semiconductor package according to example embodiments.

FIG. 18 is a schematic block diagram of an electronic device including a semiconductor package according to example embodiments.

Referring to FIG. 18, an electronic system 3000 to which the semiconductor package technology according to the example embodiments is applied is illustrated. The electronic system 3000 may include a controller 3100, an input/output device 3200, and a memory device (or a storage device) 3300. The controller 3100, the input/output device 3200, and the memory device 3300 may be connected through a bus 3500. The bus 3500 may be a passage through which data travels.

The controller 3100 may include, for example, at least one of a microprocessor, a digital signal processor, a microcontroller, and logic elements capable of performing the same functions as those of the microprocessor, the digital signal processor, and the microcontroller. The controller 3100 and memory device 3300 may include a semiconductor package according to example embodiments. The input/output device 3200 may include at least one selected from among a keypad, a keyboard, and a display device.

The memory device 3300 may be a device for storing data. The memory device 3300 may store data and/or instructions executed by the controller 3100, and the like. The memory device 3300 may include a volatile memory element and/or a non-volatile memory element. Alternatively, the memory device 3300 may be formed of a flash memory. For example, a flash memory to which the semiconductor package technology according to example embodiments is applied may be installed in an information processing system such as a mobile device or a desktop computer. Such a flash memory may include a semiconductor disk device (SSD). In this case, the electronic system 3000 may stably store a large amount of data in the flash memory system.

The electronic system 3000 may further include an interface 3400 for transferring data to or receiving data from a communication network. The interface 3400 may be in wired or wireless form. For example, the interface 3400 may include an antenna or a wired/wireless transceiver. Although not shown, the electronic system 3000 may further include an application chipset, a camera image processor (CIS), an input/output device, and the like.

The electronic system 3000 may be implemented as a mobile system, a personal computer, an industrial computer, or a logic system that performs various functions. For example, the mobile system may be one of a personal digital assistant (PDA), a portable computer, a web tablet, a mobile phone, a wireless phone, a laptop computer, a memory card, a digital music system, and an information transmission/reception system. In a case in which the electronic system 3000 is equipment capable of performing wireless communications, the electronic system 3000 may be used in a communications interface protocol such as a third-generation communications system such as CDMA, GSM, NADC, E-TDMA, WCDAM, CDMA2000, etc.

According to example embodiments, since the interposer substrate includes the recess region and the upper dummy wiring layer, the interposer substrate with improved reliability and the semiconductor package including the interposer substrate may be provided.

While example embodiments have been illustrated and described above, it will be apparent to those skilled in the art that modifications and variations could be made without departing from the scope of the present inventive concept as defined by the appended claims.

What is claimed is:

1. A semiconductor package comprising:
    a first semiconductor package including a first substrate and a lower semiconductor chip mounted on the first substrate;
    a second semiconductor package stacked on the first semiconductor package and including a second substrate and an upper semiconductor chip mounted on the second substrate; and
    an interposer substrate interposed between the first semiconductor package and the second semiconductor package and having a recess recessed from a lower surface facing the lower semiconductor chip,
    wherein the interposer substrate includes a dummy wiring layer disposed to be adjacent to the recess in a region overlapped with the lower semiconductor chip, and
    wherein the dummy wiring layer is electrically floating.

2. The semiconductor package of claim 1, wherein the interposer substrate further includes a lower insulating layer covering a lower surface of the dummy wiring layer.

3. The semiconductor package of claim 1, wherein at least a portion of the dummy wiring layer is exposed to the recess.

4. The semiconductor package of claim 3, wherein at least a portion of the dummy wiring layer is in contact with an upper surface of the lower semiconductor chip.

5. The semiconductor package of claim 1, wherein the dummy wiring layer has a single pattern or includes a plurality of patterned patterns.

6. The semiconductor package of claim 1, wherein the interposer substrate further includes protrusions spaced apart from each other on a lower surface forming the recess.

7. The semiconductor package of claim 6, wherein at least portions of the protrusions are in contact with an upper surface of the lower semiconductor chip.

8. The semiconductor package of claim 1, wherein the interposer substrate includes:

a core insulating layer having an embedded wiring layer;
a lower insulating layer disposed below the core insulating layer and having the recess; and
an interconnecting wiring layer disposed on a lower surface of the lower insulating layer, on a periphery of the recess.

9. The semiconductor package of claim 8, wherein the dummy wiring layer is disposed within the lower insulating layer.

10. The semiconductor package of claim 8, wherein the core insulating layer and the lower insulating layer include different materials.

11. The semiconductor package of claim 10, wherein the core insulating layer includes glass fiber and the lower insulating layer consists of a resin and an inorganic filler.

12. The semiconductor package of claim 8, further comprising:
connecting terminals disposed between the interconnecting wiring layer and the first substrate.

13. The semiconductor package of claim 1, wherein the interposer substrate further includes a peripheral wiring layer disposed on a perimeter of the recess, on the same vertical level as the dummy wiring layer.

14. The semiconductor package of claim 1, wherein the first substrate has a cavity corresponding to a region in which the lower semiconductor chip is mounted.

15. A semiconductor package comprising:
a substrate;
a semiconductor chip mounted on the substrate;
an interposer substrate disposed on the semiconductor chip and electrically connected to the substrate; and
connecting terminals connecting the substrate and the interposer substrate,
wherein the interposer substrate includes:
a core insulating layer having an embedded wiring layer;
a lower insulating layer disposed below the core insulating layer and having a recess recessed from a lower surface facing the semiconductor chip;
a dummy wiring layer disposed between the embedded wiring layer and the semiconductor chip above the recess, the dummy wiring layer being electrically floating; and
an interconnecting wiring layer disposed on a lower surface of the lower insulating layer and connected to the connecting terminals, on a periphery of the recess.

16. The semiconductor package of claim 15, wherein the dummy wiring layer is disposed on a lower surface of the core insulating layer.

17. The semiconductor package of claim 15, wherein the dummy wiring layer is disposed within the lower insulating layer.

18. The semiconductor package of claim 15, wherein the lower insulating layer exposes at least a portion of the dummy wiring layer.

19. An interposer substrate comprising:
a core insulating layer having an embedded wiring layer;
a lower insulating layer disposed below the core insulating layer and having a recess recessed from a lower surface at the center of the lower surface; and
a dummy wiring layer disposed on a lower surface of the core insulating layer above the recess,
wherein the dummy wiring layer is electrically floating.

20. The interposer substrate of claim 19, further comprising:
an interconnecting wiring layer disposed on a lower surface of the lower insulating layer, on a perimeter of the recess; and
connecting terminals disposed on a lower surface of the interconnecting wiring layer.

* * * * *